(12) United States Patent  
Khlat

(10) Patent No.: US 12,126,305 B2
(45) Date of Patent: Oct. 22, 2024

(54) RADIO FREQUENCY (RF) EQUALIZER IN AN ENVELOPE TRACKING (ET) CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 509 days.

(21) Appl. No.: 17/331,996

(22) Filed: May 27, 2021

(65) Prior Publication Data

US 2022/0385239 A1  Dec. 1, 2022

(51) Int. Cl.
*H03F 1/02* (2006.01)
*H03F 3/45* (2006.01)
*H04B 1/04* (2006.01)

(52) U.S. Cl.
CPC ....... *H03F 1/0233* (2013.01); *H03F 3/45475* (2013.01); *H04B 1/04* (2013.01); *H03F 2200/105* (2013.01); *H03F 2200/451* (2013.01)

(58) Field of Classification Search
CPC ........... H03F 3/45475; H03F 2200/105; H03F 2200/451; H03F 1/0233; H04B 1/04
USPC ........................................................ 330/252
See application file for complete search history.

(56) References Cited

U.S. PATENT DOCUMENTS

| | | |
|---|---|---|
| 4,646,035 A | 2/1987 | Chapelle |
| 5,266,936 A | 11/1993 | Saitoh |
| 5,510,753 A | 4/1996 | French |
| 5,838,732 A | 11/1998 | Carney |
| 6,107,862 A | 8/2000 | Mukainakano et al. |
| 6,141,377 A | 10/2000 | Sharper et al. |
| 6,141,541 A | 10/2000 | Midya et al. |
| 6,411,531 B1 | 6/2002 | Nork et al. |
| 6,985,033 B1 | 1/2006 | Shirali et al. |
| 7,043,213 B2 | 5/2006 | Robinson et al. |
| 7,193,467 B2 | 3/2007 | Garlepp et al. |
| 7,471,155 B1 | 12/2008 | Levesque |
| 7,570,931 B2 | 8/2009 | McCallister et al. |
| 7,994,862 B1 | 8/2011 | Pukhovski |
| 8,461,928 B2 | 6/2013 | Yahav et al. |
| 8,493,141 B2 | 7/2013 | Khlat et al. |

(Continued)

FOREIGN PATENT DOCUMENTS

| | | |
|---|---|---|
| CN | 103916093 A | 7/2014 |
| CN | 104185953 A | 12/2014 |

(Continued)

OTHER PUBLICATIONS

First Office Action for Chinese Patent Application No. 202010083654.0, dated May 12, 2023, 17 pages.

(Continued)

*Primary Examiner* — Andrea Lindgren Baltzell
*Assistant Examiner* — Jose E Pinero
(74) *Attorney, Agent, or Firm* — Withrow & Terranova, P.L.L.C.

(57) ABSTRACT

A radio frequency (RF) equalizer in an envelope tracking (ET) circuit is disclosed. A transmitter chain includes an ET circuit having an RF equalizer therein. The RF equalizer includes a two operational amplifier (op-amp) structure that provides a relatively flat gain and a relatively constant negative group delay across a frequency range of interest (e.g., up to 200 MHz). The simple two op-amp structure provides frequency response equalization and time tuning adjustment and/or creates a window Vcc signal.

20 Claims, 12 Drawing Sheets

(56) References Cited

U.S. PATENT DOCUMENTS

| | | |
|---|---|---|
| 8,519,788 B2 | 8/2013 | Khlat |
| 8,588,713 B2 | 11/2013 | Khlat |
| 8,718,188 B2 | 5/2014 | Balteanu et al. |
| 8,723,492 B2 | 5/2014 | Korzeniowski |
| 8,725,218 B2 | 5/2014 | Brown et al. |
| 8,774,065 B2 | 7/2014 | Khlat et al. |
| 8,803,603 B2 | 8/2014 | Wimpenny |
| 8,818,305 B1 | 8/2014 | Schwent et al. |
| 8,854,129 B2 | 10/2014 | Wilson |
| 8,879,665 B2 | 11/2014 | Xia et al. |
| 8,913,690 B2 | 12/2014 | Onishi |
| 8,942,651 B2 | 1/2015 | Jones |
| 8,947,161 B2 | 2/2015 | Khlat et al. |
| 8,989,682 B2 | 3/2015 | Ripley et al. |
| 9,018,921 B2 | 4/2015 | Gurlahosur |
| 9,020,451 B2 | 4/2015 | Khlat |
| 9,041,364 B2 | 5/2015 | Khlat |
| 9,041,365 B2 | 5/2015 | Kay et al. |
| 9,055,529 B2 | 6/2015 | Shih |
| 9,065,509 B1 | 6/2015 | Yan et al. |
| 9,069,365 B2 | 6/2015 | Brown et al. |
| 9,098,099 B2 | 8/2015 | Park et al. |
| 9,166,538 B2 | 10/2015 | Hong et al. |
| 9,166,830 B2 | 10/2015 | Camuffo et al. |
| 9,167,514 B2 | 10/2015 | Dakshinamurthy et al. |
| 9,172,303 B2 | 10/2015 | Vasadi et al. |
| 9,197,182 B2 | 11/2015 | Baxter et al. |
| 9,225,362 B2 | 12/2015 | Drogi et al. |
| 9,247,496 B2 | 1/2016 | Khlat |
| 9,263,997 B2 | 2/2016 | Vinayak |
| 9,270,230 B2 | 2/2016 | Henshaw et al. |
| 9,270,239 B2 | 2/2016 | Drogi et al. |
| 9,271,236 B2 | 2/2016 | Drogi |
| 9,280,163 B2 | 3/2016 | Kay et al. |
| 9,288,098 B2 | 3/2016 | Yan et al. |
| 9,298,198 B2 | 3/2016 | Kay et al. |
| 9,344,304 B1 | 5/2016 | Cohen |
| 9,356,512 B2 | 5/2016 | Chowdhury et al. |
| 9,362,868 B2 | 6/2016 | Al-Qaq et al. |
| 9,377,797 B2 | 6/2016 | Kay et al. |
| 9,379,667 B2 | 6/2016 | Khlat et al. |
| 9,445,371 B2 | 9/2016 | Khesbak et al. |
| 9,515,622 B2 | 12/2016 | Nentwig et al. |
| 9,520,907 B2 | 12/2016 | Peng et al. |
| 9,584,071 B2 | 2/2017 | Khlat |
| 9,595,869 B2 | 3/2017 | Lerdworatawee |
| 9,595,981 B2 | 3/2017 | Khlat |
| 9,596,110 B2 | 3/2017 | Jiang et al. |
| 9,614,477 B1 | 4/2017 | Rozenblit et al. |
| 9,634,666 B2 | 4/2017 | Krug |
| 9,705,451 B2 | 7/2017 | Takenaka et al. |
| 9,748,845 B1 | 8/2017 | Kotikalapoodi |
| 9,806,676 B2 | 10/2017 | Balteanu et al. |
| 9,831,834 B2 | 11/2017 | Balteanu et al. |
| 9,837,962 B2 | 12/2017 | Mathe et al. |
| 9,900,204 B2 | 2/2018 | Levesque et al. |
| 9,923,520 B1 | 3/2018 | Abdelfattah et al. |
| 10,003,416 B1 | 6/2018 | Lloyd |
| 10,084,376 B2 | 9/2018 | Lofthouse |
| 10,090,808 B1 | 10/2018 | Henzler et al. |
| 10,090,809 B1 | 10/2018 | Khlat |
| 10,097,145 B1 | 10/2018 | Khlat et al. |
| 10,103,693 B2 | 10/2018 | Zhu et al. |
| 10,110,169 B2 | 10/2018 | Khesbak et al. |
| 10,158,329 B1 | 12/2018 | Khlat |
| 10,158,330 B1 | 12/2018 | Khlat |
| 10,170,989 B2 | 1/2019 | Balteanu et al. |
| 10,291,126 B1 | 5/2019 | Wei et al. |
| 10,291,181 B2 | 5/2019 | Kim et al. |
| 10,326,408 B2 | 6/2019 | Khlat et al. |
| 10,361,744 B1 | 7/2019 | Khlat |
| 10,382,071 B2 | 8/2019 | Rozek et al. |
| 10,476,437 B2 | 11/2019 | Nag et al. |
| 10,622,900 B1 | 4/2020 | Wei et al. |
| 10,756,675 B2 | 8/2020 | Leipold et al. |
| 10,862,431 B1 | 12/2020 | Khlat |
| 10,873,260 B2 | 12/2020 | Yan et al. |
| 10,879,804 B2 | 12/2020 | Kim et al. |
| 11,050,433 B1 | 6/2021 | Melanson et al. |
| 11,121,684 B2 | 9/2021 | Henzler et al. |
| 11,128,261 B2 | 9/2021 | Ranta et al. |
| 11,637,531 B1 | 4/2023 | Perreault et al. |
| 11,848,564 B2 | 12/2023 | Jung et al. |
| 2002/0021110 A1 | 2/2002 | Nakagawa et al. |
| 2002/0157069 A1 | 10/2002 | Ogawa et al. |
| 2002/0167827 A1 | 11/2002 | Umeda et al. |
| 2003/0107428 A1 | 6/2003 | Khouri et al. |
| 2004/0201281 A1 | 10/2004 | Ma et al. |
| 2004/0266366 A1 | 12/2004 | Robinson et al. |
| 2005/0088160 A1 | 4/2005 | Tanaka et al. |
| 2005/0090209 A1 | 4/2005 | Behzad |
| 2005/0227646 A1 | 10/2005 | Yamazaki et al. |
| 2005/0232385 A1 | 10/2005 | Yoshikawa et al. |
| 2006/0028271 A1 | 2/2006 | Wilson |
| 2006/0240786 A1 | 10/2006 | Liu |
| 2007/0036212 A1 | 2/2007 | Leung et al. |
| 2007/0052474 A1 | 3/2007 | Saito |
| 2007/0053217 A1 | 3/2007 | Darroman |
| 2007/0258602 A1 | 11/2007 | Vepsalainen et al. |
| 2007/0290748 A1 | 12/2007 | Woo et al. |
| 2008/0116960 A1 | 5/2008 | Nakamura |
| 2008/0231115 A1 | 9/2008 | Cho et al. |
| 2008/0231358 A1 | 9/2008 | Maemura |
| 2008/0239772 A1 | 10/2008 | Oraw et al. |
| 2009/0016085 A1 | 1/2009 | Rader et al. |
| 2009/0045872 A1 | 2/2009 | Kenington |
| 2009/0191826 A1 | 7/2009 | Takinami et al. |
| 2010/0019052 A1 | 1/2010 | Yip |
| 2010/0039321 A1 | 2/2010 | Abraham |
| 2010/0283534 A1 | 11/2010 | Pierdomenico |
| 2010/0308919 A1 | 12/2010 | Adamski et al. |
| 2011/0068757 A1 | 3/2011 | Xu et al. |
| 2011/0074373 A1 | 3/2011 | Lin |
| 2011/0136452 A1 | 6/2011 | Pratt et al. |
| 2011/0148705 A1 | 6/2011 | Kenington |
| 2011/0175681 A1 | 7/2011 | Inamori et al. |
| 2011/0199156 A1 | 8/2011 | Hayakawa |
| 2011/0279179 A1 | 11/2011 | Vice |
| 2012/0062031 A1 | 3/2012 | Buthker |
| 2012/0194274 A1 | 8/2012 | Fowers et al. |
| 2012/0200435 A1 | 8/2012 | Ngo et al. |
| 2012/0274134 A1 | 11/2012 | Gasparini et al. |
| 2012/0281597 A1 | 11/2012 | Khlat et al. |
| 2012/0286576 A1 | 11/2012 | Jing et al. |
| 2012/0299645 A1 | 11/2012 | Southcombe et al. |
| 2012/0299647 A1 | 11/2012 | Honjo et al. |
| 2012/0326691 A1 | 12/2012 | Kuan et al. |
| 2013/0021827 A1 | 1/2013 | Ye |
| 2013/0063118 A1 | 3/2013 | Nguyen et al. |
| 2013/0072139 A1 | 3/2013 | Kang et al. |
| 2013/0100991 A1 | 4/2013 | Woo |
| 2013/0127548 A1 | 5/2013 | Popplewell et al. |
| 2013/0130724 A1 | 5/2013 | Kumar Reddy et al. |
| 2013/0141064 A1 | 6/2013 | Kay et al. |
| 2013/0162233 A1 | 6/2013 | Marty |
| 2013/0176961 A1 | 7/2013 | Kanamarlapudi et al. |
| 2013/0187711 A1 | 7/2013 | Goedken et al. |
| 2013/0200865 A1 | 8/2013 | Wimpenny |
| 2013/0234513 A1 | 9/2013 | Bayer |
| 2013/0234692 A1 | 9/2013 | Liang et al. |
| 2013/0271221 A1 | 10/2013 | Levesque et al. |
| 2014/0009226 A1 | 1/2014 | Severson |
| 2014/0028370 A1 | 1/2014 | Wimpenny |
| 2014/0028390 A1 | 1/2014 | Davis |
| 2014/0055197 A1 | 2/2014 | Khlat et al. |
| 2014/0057684 A1 | 2/2014 | Khlat |
| 2014/0097820 A1 | 4/2014 | Miyamae |
| 2014/0103995 A1 | 4/2014 | Langer |
| 2014/0145692 A1 | 5/2014 | Miyamae |
| 2014/0155002 A1 | 6/2014 | Dakshinamurthy et al. |
| 2014/0169427 A1 | 6/2014 | Asenio et al. |
| 2014/0184335 A1 | 7/2014 | Nobbe et al. |
| 2014/0199949 A1 | 7/2014 | Nagode et al. |
| 2014/0203869 A1 | 7/2014 | Khlat et al. |

(56) References Cited

U.S. PATENT DOCUMENTS

| | | |
|---|---|---|
| 2014/0210550 A1 | 7/2014 | Mathe et al. |
| 2014/0213196 A1 | 7/2014 | Langer et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0315504 A1 | 10/2014 | Sakai et al. |
| 2014/0361830 A1 | 12/2014 | Mathe et al. |
| 2014/0361837 A1 | 12/2014 | Strange et al. |
| 2015/0048883 A1 | 2/2015 | Vinayak |
| 2015/0071382 A1 | 3/2015 | Wu et al. |
| 2015/0098523 A1 | 4/2015 | Lim et al. |
| 2015/0139358 A1 | 5/2015 | Asuri et al. |
| 2015/0145600 A1 | 5/2015 | Hur et al. |
| 2015/0155836 A1 | 6/2015 | Midya et al. |
| 2015/0188432 A1 | 7/2015 | Vannorsdel et al. |
| 2015/0234402 A1 | 8/2015 | Kay et al. |
| 2015/0236652 A1 | 8/2015 | Yang et al. |
| 2015/0236654 A1 | 8/2015 | Jiang et al. |
| 2015/0236729 A1 | 8/2015 | Peng et al. |
| 2015/0236877 A1 | 8/2015 | Peng et al. |
| 2015/0280652 A1 | 10/2015 | Cohen |
| 2015/0302845 A1 | 10/2015 | Nakano et al. |
| 2015/0311791 A1 | 10/2015 | Tseng et al. |
| 2015/0326114 A1 | 11/2015 | Rolland |
| 2015/0333781 A1 | 11/2015 | Alon et al. |
| 2016/0050629 A1 | 2/2016 | Khesbak et al. |
| 2016/0065137 A1 | 3/2016 | Khlat |
| 2016/0065139 A1 | 3/2016 | Lee et al. |
| 2016/0099686 A1 | 4/2016 | Perreault et al. |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0164550 A1 | 6/2016 | Pilgram |
| 2016/0164551 A1 | 6/2016 | Khlat et al. |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0249300 A1 | 8/2016 | Tsai et al. |
| 2016/0294587 A1 | 10/2016 | Jiang et al. |
| 2017/0005619 A1 | 1/2017 | Khlat |
| 2017/0005676 A1 | 1/2017 | Yan et al. |
| 2017/0006543 A1 | 1/2017 | Khlat |
| 2017/0012675 A1 | 1/2017 | Frederick |
| 2017/0018718 A1 | 1/2017 | Jang et al. |
| 2017/0141736 A1 | 5/2017 | Pratt et al. |
| 2017/0149240 A1 | 5/2017 | Wu et al. |
| 2017/0187187 A1 | 6/2017 | Amin et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0123516 A1 | 5/2018 | Kim et al. |
| 2018/0152144 A1 | 5/2018 | Choo et al. |
| 2018/0254530 A1 | 9/2018 | Wigney |
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2018/0375476 A1 | 12/2018 | Balteanu et al. |
| 2018/0375483 A1 | 12/2018 | Balteanu et al. |
| 2019/0028060 A1 | 1/2019 | Jo et al. |
| 2019/0044480 A1 | 2/2019 | Khlat |
| 2019/0068051 A1 | 2/2019 | Yang et al. |
| 2019/0068234 A1 | 2/2019 | Khlat et al. |
| 2019/0097277 A1 | 3/2019 | Fukae |
| 2019/0103766 A1 | 4/2019 | Von Novak, III et al. |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0199215 A1 | 6/2019 | Zhao et al. |
| 2019/0222178 A1 | 7/2019 | Khlat et al. |
| 2019/0229623 A1 | 7/2019 | Tsuda et al. |
| 2019/0238095 A1 | 8/2019 | Khlat |
| 2019/0253023 A1 | 8/2019 | Yang et al. |
| 2019/0267956 A1 | 8/2019 | Granger-Jones et al. |
| 2019/0288645 A1 | 9/2019 | Nag et al. |
| 2019/0222175 A1 | 10/2019 | Khlat et al. |
| 2019/0319584 A1 | 10/2019 | Khlat et al. |
| 2019/0386565 A1 | 12/2019 | Rosolowski et al. |
| 2020/0007090 A1 | 1/2020 | Khlat et al. |
| 2020/0036337 A1 | 1/2020 | Khlat |
| 2020/0091878 A1 | 3/2020 | Maxim et al. |
| 2020/0106392 A1 | 4/2020 | Khlat et al. |
| 2020/0127608 A1 | 4/2020 | Khlat |
| 2020/0127625 A1 | 4/2020 | Khlat |
| 2020/0127730 A1 | 4/2020 | Khlat |
| 2020/0136561 A1 | 4/2020 | Khlat et al. |
| 2020/0136563 A1 | 4/2020 | Khlat |
| 2020/0136575 A1 | 4/2020 | Khlat et al. |
| 2020/0144966 A1 | 5/2020 | Khlat |
| 2020/0153394 A1 | 5/2020 | Khlat et al. |
| 2020/0177131 A1 | 6/2020 | Khlat |
| 2020/0204116 A1 | 6/2020 | Khlat |
| 2020/0228063 A1 | 7/2020 | Khlat |
| 2020/0259456 A1 | 8/2020 | Khlat |
| 2020/0259685 A1 | 8/2020 | Khlat |
| 2020/0266766 A1 | 8/2020 | Khlat et al. |
| 2020/0304020 A1 | 9/2020 | Lu et al. |
| 2020/0313622 A1 | 10/2020 | Eichler et al. |
| 2020/0321848 A1 | 10/2020 | Khlat |
| 2020/0321917 A1 | 10/2020 | Nomiyama et al. |
| 2020/0328677 A1 | 10/2020 | Amin et al. |
| 2020/0328720 A1 | 10/2020 | Khlat |
| 2020/0336105 A1 | 10/2020 | Khlat |
| 2020/0336111 A1 | 10/2020 | Khlat |
| 2020/0350865 A1 | 11/2020 | Khlat |
| 2020/0350866 A1 | 11/2020 | Pehlke |
| 2020/0350878 A1 | 11/2020 | Drogi et al. |
| 2020/0382061 A1 | 12/2020 | Khlat |
| 2020/0382066 A1 | 12/2020 | Khlat |
| 2021/0036596 A1 | 2/2021 | Jeon et al. |
| 2021/0036604 A1 | 2/2021 | Khlat et al. |
| 2021/0075372 A1 | 3/2021 | Henzler et al. |
| 2021/0099137 A1 | 4/2021 | Drogi et al. |
| 2021/0159590 A1 | 5/2021 | Na et al. |
| 2021/0175896 A1 | 6/2021 | Melanson et al. |
| 2021/0184708 A1 | 6/2021 | Khlat |
| 2021/0194437 A1 | 6/2021 | Stockert |
| 2021/0194515 A1 | 6/2021 | Go et al. |
| 2021/0194517 A1 | 6/2021 | Mirea et al. |
| 2021/0194522 A1 | 6/2021 | Stockert et al. |
| 2021/0211108 A1 | 7/2021 | Khlat |
| 2021/0226585 A1 | 7/2021 | Khlat |
| 2021/0234513 A1 | 7/2021 | Khlat |
| 2021/0257971 A1 | 8/2021 | Kim et al. |
| 2021/0265953 A1 | 8/2021 | Khlat |
| 2021/0281228 A1 | 9/2021 | Khlat |
| 2021/0288615 A1 | 9/2021 | Khlat |
| 2021/0305944 A1 | 9/2021 | Scott et al. |
| 2021/0356299 A1* | 11/2021 | Park .................. G01D 5/142 |
| 2022/0021348 A1 | 1/2022 | Philpott et al. |
| 2022/0094256 A1 | 3/2022 | Radhakrishnan et al. |
| 2022/0103137 A1 | 3/2022 | Khlat et al. |
| 2022/0123698 A1 | 4/2022 | Goto et al. |
| 2022/0181974 A1 | 6/2022 | Liu et al. |
| 2023/0113677 A1 | 4/2023 | Boley et al. |

FOREIGN PATENT DOCUMENTS

| | | |
|---|---|---|
| CN | 104620509 A | 5/2015 |
| CN | 104954301 A | 9/2015 |
| CN | 105322894 A | 2/2016 |
| CN | 105680807 A | 6/2016 |
| CN | 105721366 A | 6/2016 |
| CN | 106208974 A | 12/2016 |
| CN | 106209270 A | 12/2016 |

(56) References Cited

FOREIGN PATENT DOCUMENTS

| | | |
|---|---|---|
| CN | 106877824 A | 6/2017 |
| CN | 107093987 A | 8/2017 |
| CN | 107980205 A | 5/2018 |
| CN | 108141184 A | 6/2018 |
| CN | 109150212 A | 1/2019 |
| EP | 3174199 A2 | 5/2012 |
| EP | 2909928 A1 | 8/2015 |
| JP | H03104422 A | 5/1991 |
| WO | 2018182778 A1 | 10/2018 |
| WO | 2020206246 A1 | 10/2020 |
| WO | 2021016350 A1 | 1/2021 |
| WO | 2021046453 A1 | 3/2021 |
| WO | 2022103493 A1 | 5/2022 |

OTHER PUBLICATIONS

Notification to Grant for Chinese Patent Application No. 202010097807.7, dated Jul. 11, 2023, 14 pages.
International Preliminary Report on Patentability for International Patent Application No. PCT/US2021/050892, dated Oct. 24, 2022, 20 pages.
Advisory Action for U.S. Appl. No. 17/073,764, dated May 26, 2023, 3 pages.
Notice of Allowance for U.S. Appl. No. 15/964,762, dated Mar. 18, 2019, 7 pages.
Quayle Action for U.S. Appl. No. 16/589,940, dated Dec. 4, 2020, 8 pages.
Notice of Allowance for U.S. Appl. No. 16/122,611, dated Jan. 13, 2021, 8 pages.
Notice of Allowance for U.S. Appl. No. 16/284,023, dated Jan. 19, 2021, 7 pages.
Notice of Allowance for U.S. Appl. No. 16/416,812, dated Feb. 16, 2021, 8 pages.
Non-Final Office Action for U.S. Appl. No. 16/689,236 dated Mar. 2, 2021, 15 pages.
Notice of Allowance for U.S. Appl. No. 16/435,940, dated Dec. 21, 2020, 7 pages.
Notice of Allowance for U.S. Appl. No. 16/774,060, dated Feb. 3, 2021, 7 pages.
Notice of Allowance for U.S. Appl. No. 16/590,790, dated Jan. 27, 2021, 7 pages.
Notice of Allowance for U.S. Appl. No. 16/661,061, dated Feb. 10, 2021, 7 pages.
Notice of Allowance for U.S. Appl. No. 16/122,611, dated Apr. 1, 2021, 8 pages.
Non-Final Office Action for U.S. Appl. No. 16/582,471, dated Mar. 24, 2021, 11 pages.
Wan, F. et al., "Negative Group Delay Theory of a Four-Port RC-Network Feedback Operational Amplifier," IEEE Access, vol. 7, Jun. 13, 2019, IEEE, 13 pages.
Notice of Allowance for U.S. Appl. No. 16/689,236 dated Jun. 9, 2021, 7 pages.
Non-Final Office Action for U.S. Appl. No. 16/775,554, dated Jun. 14, 2021, 5 pages.
Notice of Allowance for U.S. Appl. No. 16/582,471, dated Jun. 22, 2021, 9 pages.
Non-Final Office Action for U.S. Appl. No. 16/597,952, dated May 26, 2021, 7 pages.
Notice of Allowance for U.S. Appl. No. 16/834,049, dated Jun. 24, 2021, 8 pages.
U.S. Appl. No. 16/834,049, filed Mar. 30, 2020.
U.S. Appl. No. 17/163,642, filed Feb. 1, 2021.
U.S. Appl. No. 17/032,553, filed Sep. 25, 2020.
U.S. Appl. No. 17/073,764, filed Oct. 19, 2020.
U.S. Appl. No. 17/363,522, filed Jun. 30, 2021.
U.S. Appl. No. 17/343,912, filed Jun. 10, 2021.
Advisory Action for U.S. Appl. No. 16/807,575, dated Jul. 28, 2022, 3 pages.
Notice of Allowance for U.S. Appl. No. 16/807,575, dated Aug. 19, 2022, 8 pages.
Notice of Allowance for U.S. Appl. No. 17/148,064, dated Aug. 18, 2022, 8 pages.
Non-Final Office Action for U.S. Appl. No. 17/163,642, dated Aug. 17, 2022, 9 pages.
Final Office Action for U.S. Appl. No. 17/032,553, dated Jul. 29, 2022, 6 pages.
Final Office Action for U.S. Appl. No. 17/073,764, dated Jun. 1, 2022, 22 pages.
Advisory Action for U.S. Appl. No. 17/073,764, dated Aug. 23, 2022, 3 pages.
Extended European Search Report for European Patent Application No. 22153526.3, dated Jul. 13, 2022, 9 pages.
Notice of Allowance for U.S. Appl. No. 15/984,566, dated Mar. 18, 2019, 7 pages.
Non-Final Office Action for U.S. Appl. No. 16/263,316, dated Dec. 23, 2019, 10 pages.
Final Office Action for U.S. Appl. No. 16/263,316, dated May 13, 2020, 10 pages.
Non-Final Office Action for U.S. Appl. No. 16/263,316, dated Jul. 17, 2020, 4 pages.
Non-Final Office Action for U.S. Appl. No. 16/263,316, dated Nov. 24, 2020, 4 pages.
Notice of Allowance for U.S. Appl. No. 16/263,316, dated Mar. 30, 2021, 7 pages.
Final Office Action for U.S. Appl. No. 16/807,575, dated May 4, 2022, 12 pages.
International Preliminary Report on Patentability for International Patent Application No. PCT/US2021/052151, dated Oct. 13, 2022, 21 pages.
International Preliminary Report on Patentability for International Patent Application No. PCT/US2021/054141, dated Sep. 29, 2022, 20 pages.
Non-Final Office Action for U.S. Appl. No. 17/146,765, dated Sep. 7, 2022, 10 pages.
Final Office Action for U.S. Appl. No. 17/163,642, dated Nov. 25, 2022, 13 pages.
Notice of Allowance for U.S. Appl. No. 17/032,553, dated Oct. 11, 2022, 7 pages.
Non-Final Office Action for U.S. Appl. No. 17/073,764, dated Sep. 30, 2022, 13 pages.
Notice of Allowance for U.S. Appl. No. 17/073,764, dated Aug. 23, 2023, 12 pages.
Chen, S. et al., "A 4.5 μW 2.4 GHz Wake-Up Receiver Based on Complementary Current-Reuse RF Detector," 2015 IEEE International Symposium on Circuits and Systems (ISCAS), May 24-27, 2015, IEEE, pp. 1214-1217.
Ying, K. et al., "A Wideband Envelope Detector with Low Ripple and High Detection Speed," 2018 IEEE International Symposium on Circuits and Systems (ISCAS), May 27-30, 2018, IEEE, 5 pages.
Notice of Allowance for U.S. Appl. No. 17/011,313, dated Nov. 4, 2021, 8 pages.
Non-Final Office Action for U.S. Appl. No. 16/597,952, dated Nov. 10, 2021, 9 pages.
Quayle Action for U.S. Appl. No. 16/855,154, dated Oct. 25, 2021, 6 pages.
Notice of Allowance for U.S. Appl. No. 17/115,982, dated Nov. 12, 2021, 8 pages.
Non-Final Office Action for U.S. Appl. No. 17/126,561, dated Oct. 14, 2021, 6 pages.
Non-Final Office Action for U.S. Appl. No. 17/073,764, dated Dec. 24, 2021, 22 pages.
Non-Final Office Action for U.S. Appl. No. 14/836,634, dated May 16, 2016, 9 pages.
Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.

(56) References Cited

OTHER PUBLICATIONS

Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, dated Mar. 6, 2020, 8 pages.
Notice of Allowance for U.S. Appl. No. 16/354,234, dated Apr. 24, 2020, 9 pages.
Non-Final Office Action for U.S. Appl. No. 16/246,859, dated Apr. 28, 2020, 9 pages.
Corrected Notice of Allowability for U.S. Appl. No. 15/888,300, dated May 13, 2020, 7 pages.
Notice of Allowance for U.S. Appl. No. 16/155,127, dated Jun. 1, 2020, 8 pages.
Final Office Action for U.S. Appl. No. 16/174,535, dated Jul. 1, 2020, 7 pages.
Non-Final Office Action for U.S. Appl. No. 16/284,023, dated Jun. 24, 2020, 7 pages.
Non-Final Office Action for U.S. Appl. No. 16/435,940, dated Jul. 23, 2020, 6 pages.
Final Office Action for U.S. Appl. No. 15/888,300, dated Feb. 15, 2019, 15 pages.
Final Office Action for U.S. Appl. No. 16/122,611, dated Sep. 18, 2020, 17 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Notice of Allowance for U.S. Appl. No. 16/246,859, dated Sep. 18, 2020, 8 pages.
Final Office Action for U.S. Appl. No. 16/284,023, dated Nov. 3, 2020, 7 pages.
Quayle Action for U.S. Appl. No. 16/421,905, dated Aug. 25, 2020, 5 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Non-Final Office Action for U.S. Appl. No. 16/774,060, dated Aug. 17, 2020, 6 pages.
Notice of Allowance for U.S. Appl. No. 16/122,611, dated Dec. 1, 2020, 9 pages.
Notice of Allowance for U.S. Appl. No. 16/582,471, dated Feb. 1, 2022, 9 pages.
Non-Final Office Action for U.S. Appl. No. 16/807,575, dated Jan. 31, 2022, 12 pages.
International Search Report and Written Opinion for International Patent Application No. PCT/US2021/050892, dated Jan. 5, 2022, 20 pages.
International Search Report and Written Opinion for International Patent Application No. PCT/US2021/052151, dated Jan. 4, 2022, 16 pages.
International Search Report and Written Opinion for International Patent Application No. PCT/US2021/054141 dated Jan. 25, 2022, 15 pages.
Non-Final Office Action for U.S. Appl. No. 17/032,553, dated Mar. 21, 2022, 4 pages.
International Search Report and Written Opinion for International Patent Application No. PCT/US2021/052830, dated Jan. 24, 2022, 13 pages.
Non-Final Office Action for U.S. Appl. No. 17/363,568, dated Nov. 9, 2023, 8 pages.
Decision to Grant for Chinese Patent Application No. 202010083654.0, dated Sep. 11, 2023, 8 pages.
Notice of Allowance for U.S. Appl. No. 17/163,642, dated Mar. 1, 2023, 10 pages.
Final Office Action for U.S. Appl. No. 17/073,764, dated Mar. 3, 2023, 14 pages.
International Preliminary Report on Patentability for International Patent Application No. PCT/US2021/052830, dated Feb. 20, 2023, 21 pages.
Written Opinion for International Patent Application No. PCT/US2021/052830, dated Nov. 3, 2022, 7 pages.
Notification to Grant for Chinese Patent Application No. 202010083654.0, dated Nov. 9, 2023, 8 pages.
Notice of Allowance for U.S. Appl. No. 17/363,568, dated Jan. 3, 2024, 7 pages.
Non-Final Office Action for U.S. Appl. No. 17/343,912, dated Dec. 14, 2023, 6 pages.
Quayle Action for U.S. Appl. No. 17/351,560, dated Nov. 24, 2023, 7 pages.
Notice of Allowance for U.S. Appl. No. 17/351,560, dated Jan. 4, 2024, 7 pages.
Examination Report for European Patent Application No. 21790723.7, mailed Mar. 7, 2024, 5 pages.
Notice of Allowance for U.S. Appl. No. 17/363,568, mailed Apr. 17, 2024, 6 pages.
Notice of Allowance for U.S. Appl. No. 17/343,912, mailed Mar. 4, 2024, 7 pages.
Notice of Allowance for U.S. Appl. No. 17/351,560, mailed Apr. 19, 2024, 8 pages.

(56) References Cited

OTHER PUBLICATIONS

International Search Report and Written Opinion for International Patent Application No. PCT/US2023/085103, mailed Apr. 26, 2024, 17 pages.
Intention to Grant for European Patent Application No. 21806074.7, mailed May 10, 2024, 27 pages.
Ma, Hongyan, "Application and implementation of envelope tracking technology in mobile terminal RF power amplifier," Computers and Telecommunications, Oct. 2017, 18 pages.
First Office Action for Chinese Patent Application No. 201910512645.6, mailed Jul. 3, 2024, 15 pages.
First Office Action for Chinese Patent Application No. 201911232472.9, mailed Jul. 23, 2024, 10 pages.
First Office Action for Chinese Patent Application No. 201911312703.7, mailed Jul. 16, 2024, 10 pages.
Non-Final Office Action for U.S. Patent Application No. 18/254,155, mailed Sep. 4, 2024, 14 pages.
Non-Final Office Action for U.S. Appl. No. 17/579,796, mailed Aug. 30, 2024, 6 pages.

\* cited by examiner

RADIO FREQUENCY (RF) EQUALIZER IN AN ENVELOPE TRACKING (ET) CIRCUIT

FIELD OF THE DISCLOSURE

The technology of the disclosure relates generally to a radio frequency (RF) transmitter and more particularly to an equalizer within an RF transmitter.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as Wi-Fi, long-term evolution (LTE), and fifth-generation new-radio (5G-NR). To achieve the higher data rates in mobile communication devices, sophisticated power amplifiers may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking is a power management technology designed to improve efficiency levels of power amplifiers to help reduce power consumption and thermal dissipation in mobile communication devices. As the name suggests, envelope tracking employs a system that keeps track of the amplitude envelope of the signals communicated by mobile communication devices. The envelope tracking (ET) system constantly adjusts the supply voltage applied to the PAs to ensure that the power amplifiers are operating at a higher efficiency and under a required error vector magnitude (EVM) threshold (e.g., 17.5%) for a given instantaneous output power requirement of the RF signals. 5G-NR, in particular, may rely on envelope tracking with frequent changes required in relatively short time frames. Being able to handle such changes within the requisite time frames has proven challenging, and new technologies to assist in meeting such requirements are needed.

SUMMARY

Embodiments of the disclosure relate to a radio frequency (RF) equalizer in an envelope tracking (ET) circuit. In a non-limiting example, a transmitter chain includes an ET circuit having an RF equalizer therein. The RF equalizer includes a two operational amplifier (op-amp) structure that provides a relatively flat gain and a relatively constant negative group delay across a frequency range of interest (e.g., up to 200 megahertz (MH)z). The simple two op-amp structure provides frequency response equalization and time tuning adjustment and/or creates a window Vcc signal.

In one aspect, an ET circuit is disclosed. The ET circuit comprises an equalizer comprising a first branch. The first branch comprises a positive differential input node. The first branch also comprises a negative differential input node. The first branch also comprises a first operational amplifier (op-amp). The first op-amp comprises a first negative input coupled to the positive differential input node. The first op-amp also comprises a first output. The first branch also comprises a first feedback circuit coupling the first output to the first negative input. The first branch also comprises a second op-amp. The second op-amp comprises a second negative input coupled to the negative differential input node and the first output. The second op-amp also comprises a second output. The first branch also comprises a second feedback impedance network coupling the second output to the second negative input.

In another aspect, a transmitter circuit is disclosed. The transmitter circuit comprises a transceiver. The transmitter circuit also comprises an amplifier network coupled to the transceiver. The transmitter circuit also comprises an ET circuit coupled to the transceiver and the amplifier network. The ET circuit comprises an equalizer. The equalizer comprises a positive differential input node. The equalizer also comprises a negative differential input node. The equalizer also comprises a first op-amp. The first op-amp comprises a first negative input coupled to the positive differential input node. The first op-amp also comprises a first output. The equalizer also comprises a first feedback circuit coupling the first output to the first negative input. The equalizer also comprises a second op-amp. The second op-amp comprises a second negative input coupled to the negative differential input node and the first output. The second op-amp also comprises a second output. The equalizer also comprises a second feedback impedance network coupling the second output to the second negative input.

In another aspect, an equalizer is disclosed. The equalizer comprises a positive differential input node. The equalizer also comprises a negative differential input node. The equalizer also comprises a first op-amp. The first op-amp comprises a first negative input coupled to the positive differential input node. The first op-amp also comprises a first output. The equalizer also comprises a first feedback circuit coupling the first output to the first negative input. The equalizer also comprises a second op-amp. The second op-amp comprises a second negative input coupled to the negative differential input node and the first output. The second op-amp also comprises a second output. The equalizer also comprises a second feedback impedance network coupling the second output to the second negative input.

In another aspect, an ET circuit is disclosed. The ET circuit comprises an equalizer. The equalizer comprises a positive input node. The equalizer also comprises a negative input node. The equalizer also comprises a first op-amp. The first op-amp comprises a first negative input coupled to the negative input node. The first op-amp also comprises a first negative output. The first op-amp also comprises a first positive input coupled to the positive input node. The first op-amp also comprises a first positive output. The equalizer also comprises a first feedback circuit coupling the first positive output to the first negative input. The equalizer also comprises a second feedback circuit coupling the first negative output to the first positive input. The equalizer also comprises a second op-amp. The second op-amp comprises a second negative input coupled to the first positive output. The second op-amp also comprises a second positive input coupled to the first negative output. The second op-amp also comprises a second negative output. The second op-amp also comprises a second positive output. The equalizer also comprises a first feedback impedance network coupling the second negative output to the second positive input. The equalizer also comprises a second feedback impedance network coupling the second positive output to the second negative input node. The equalizer also comprises a third impedance network coupling the second positive input to the negative input node.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 4:
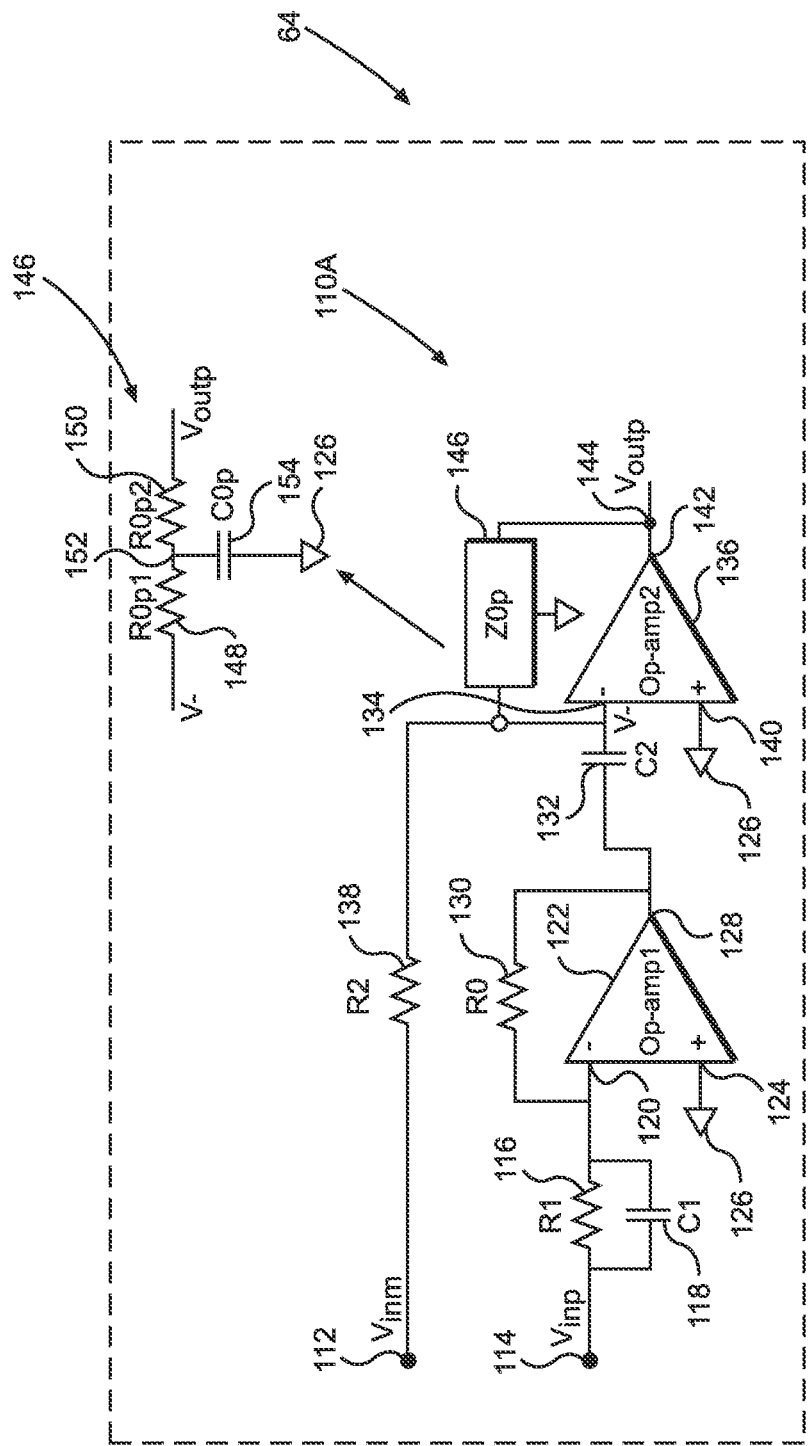
Figure 5:
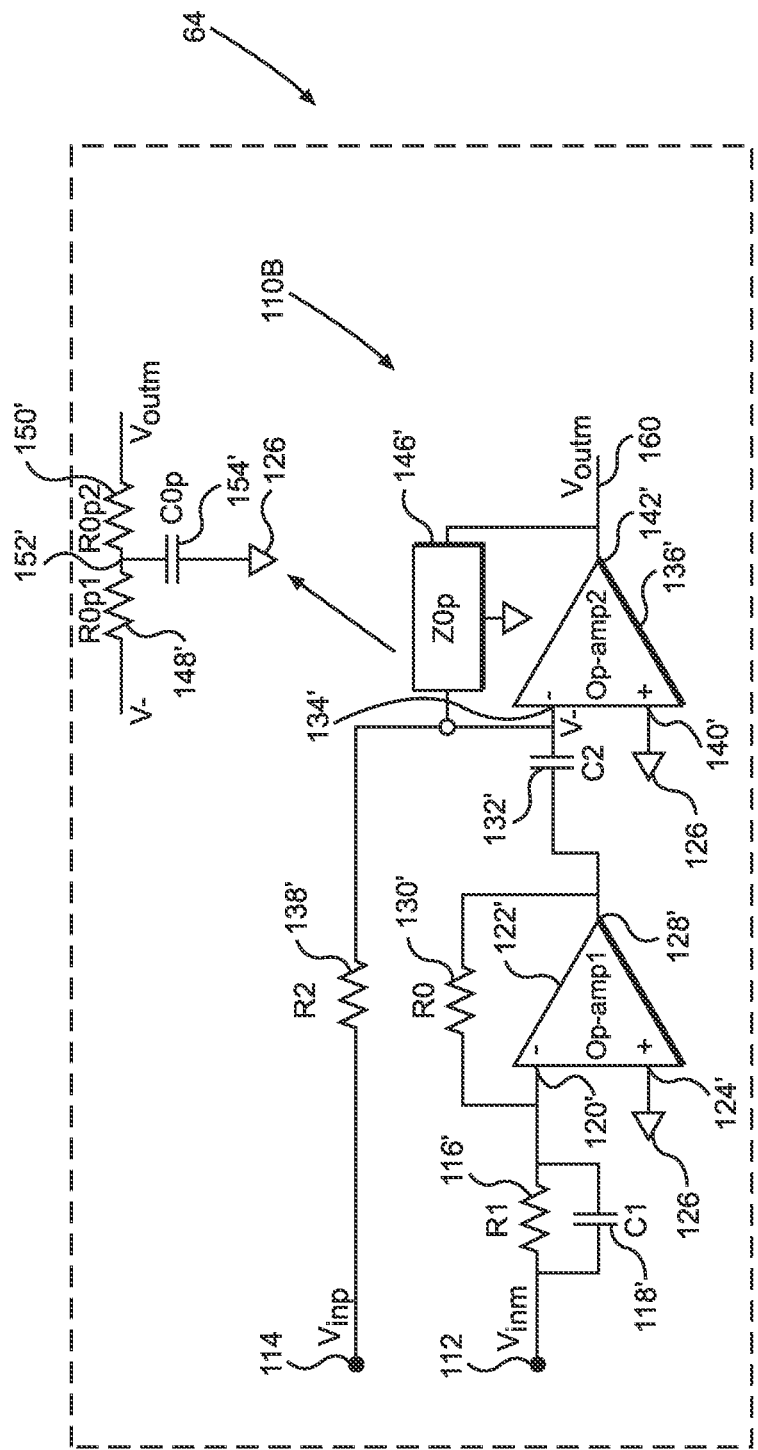
Figure 6A:
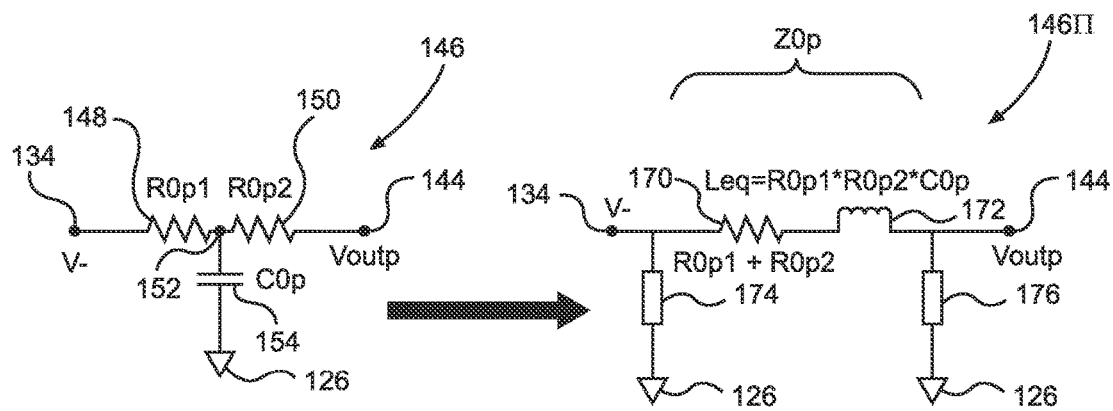
Figure 6B:
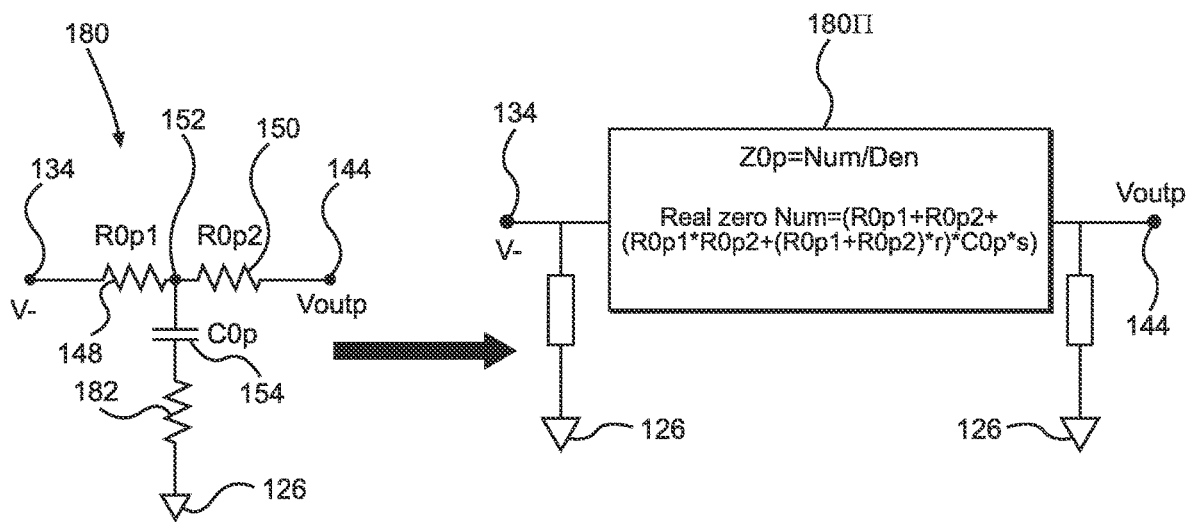
Figure 7A:
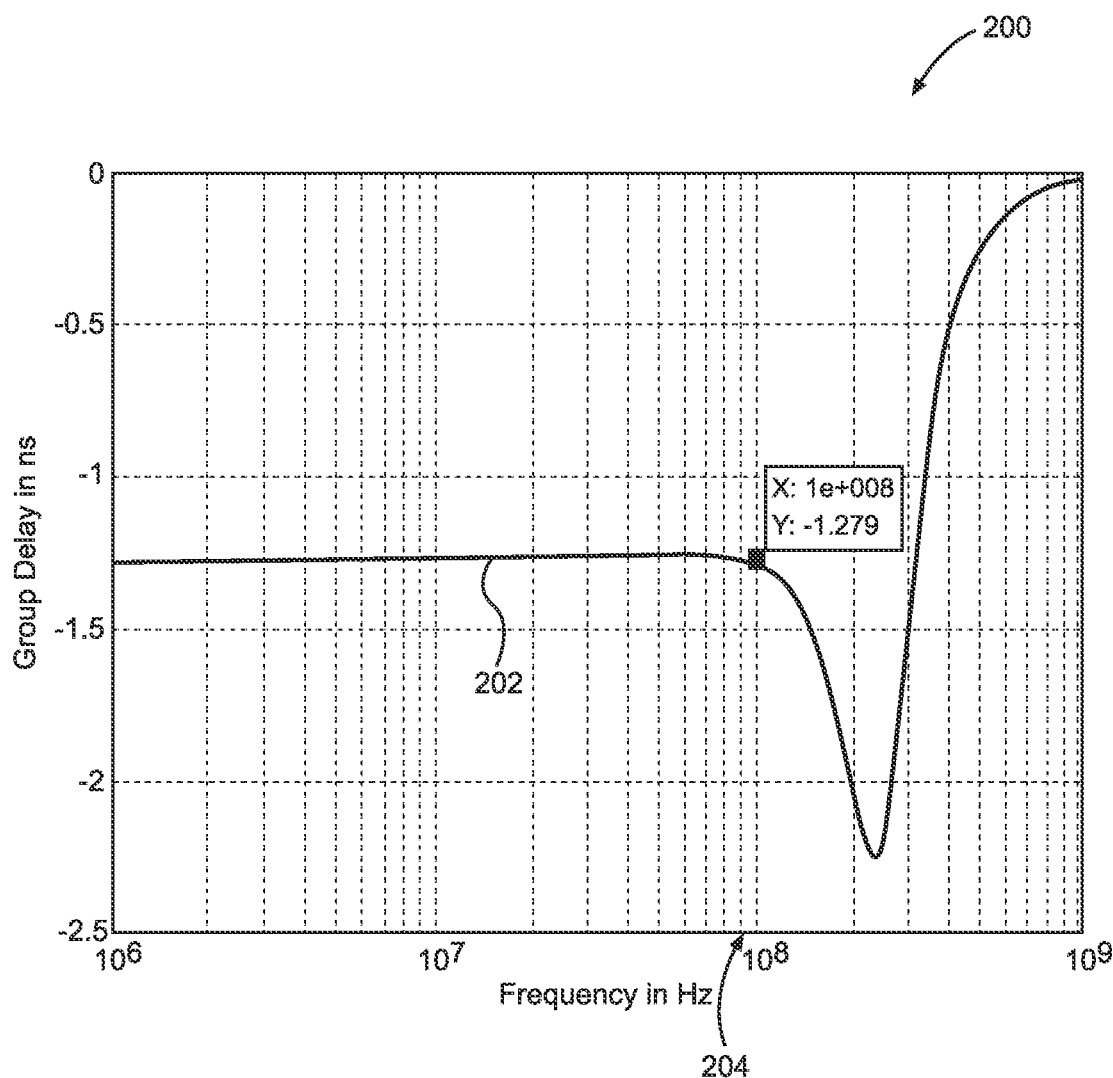
Figure 7B:
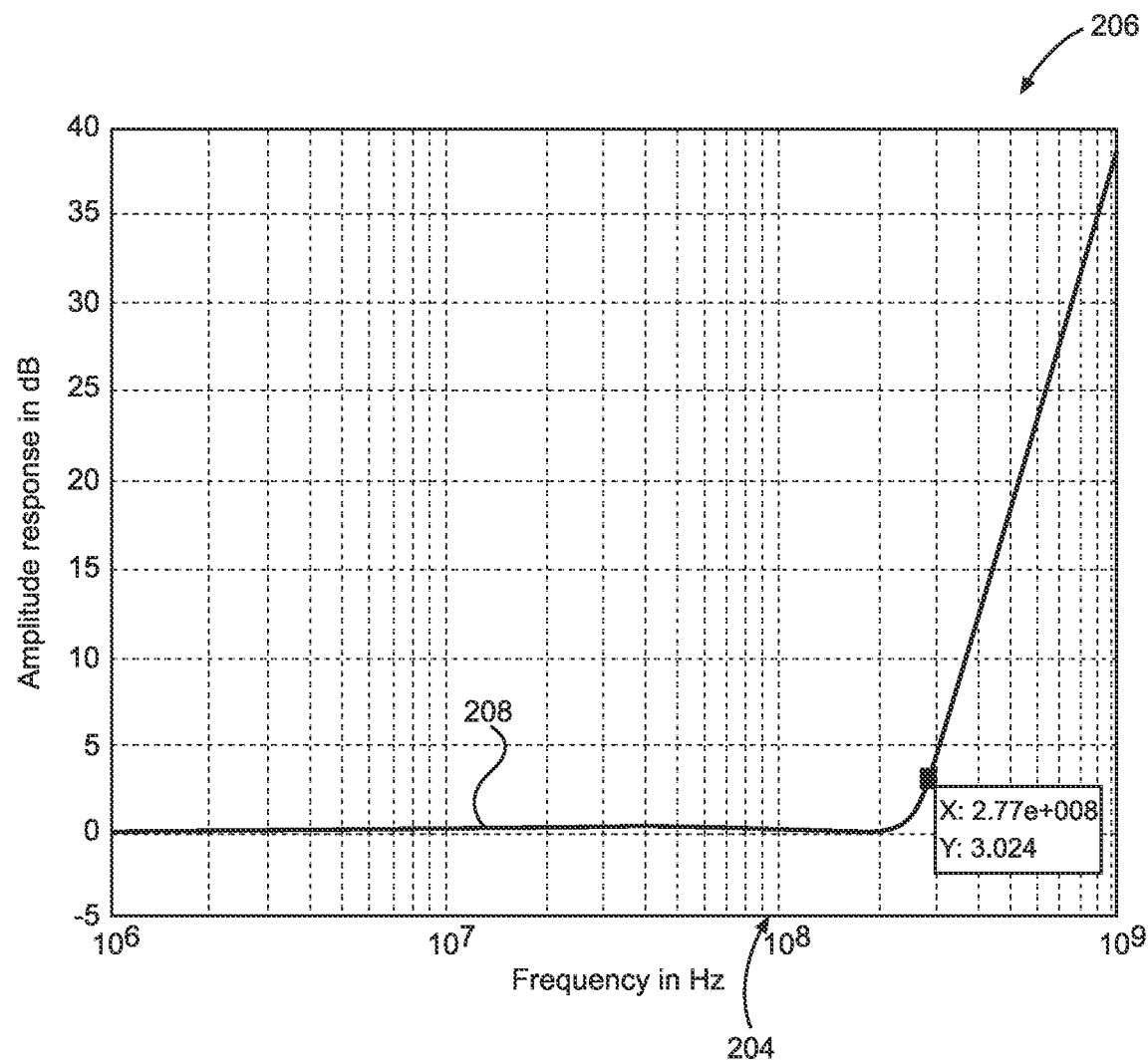
Figure 8:
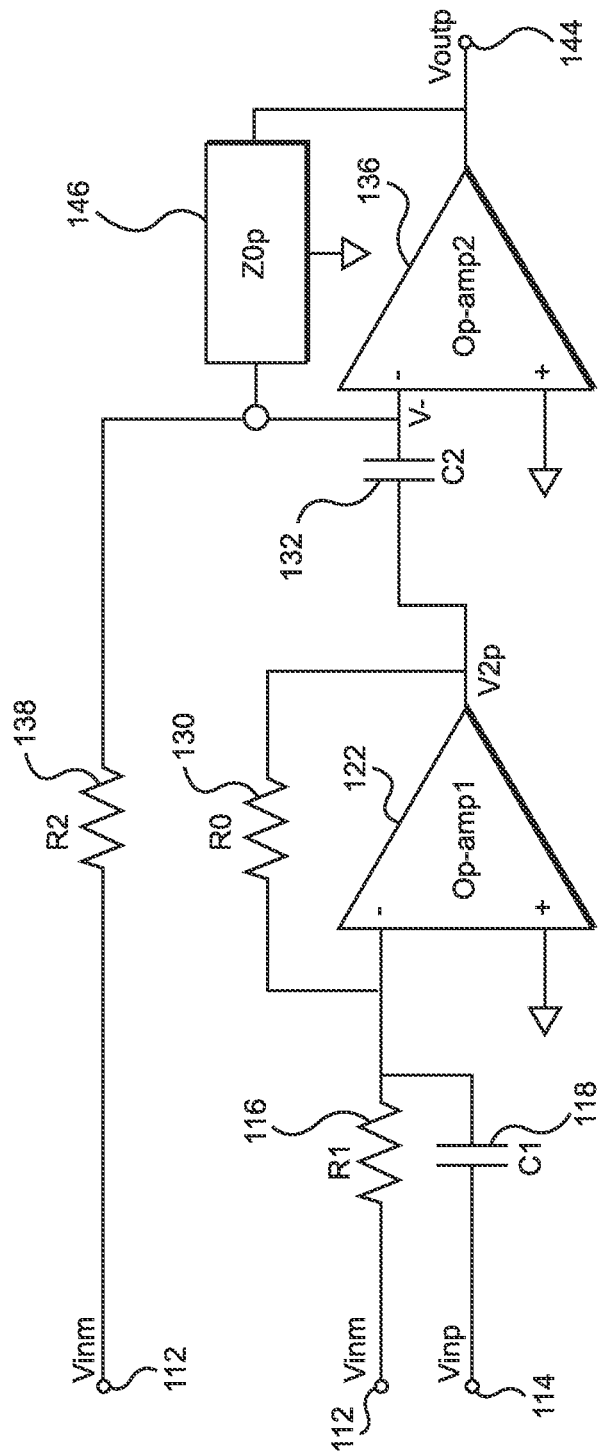
Figure 9:
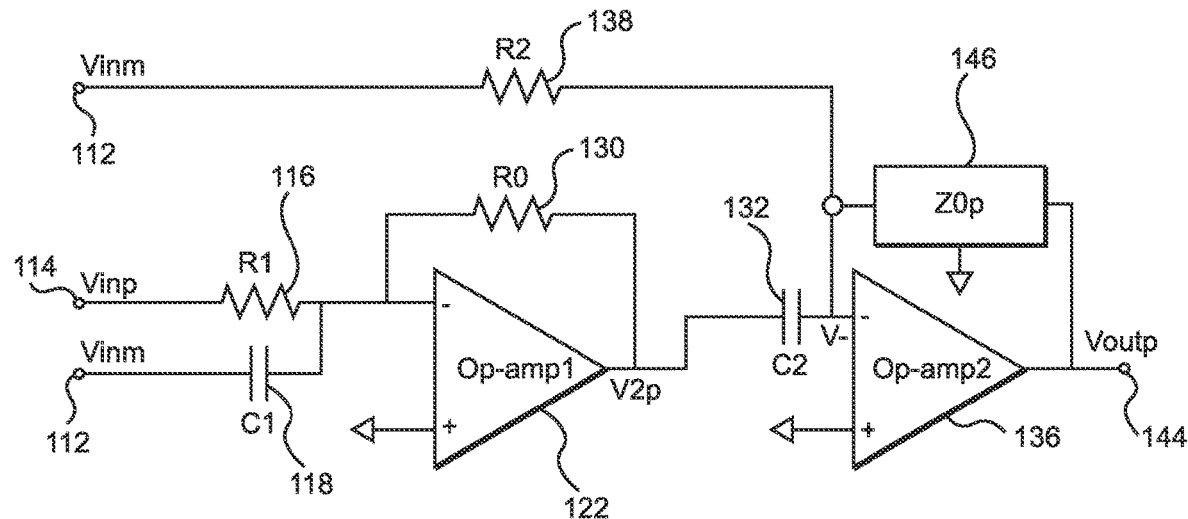
Figure 10:
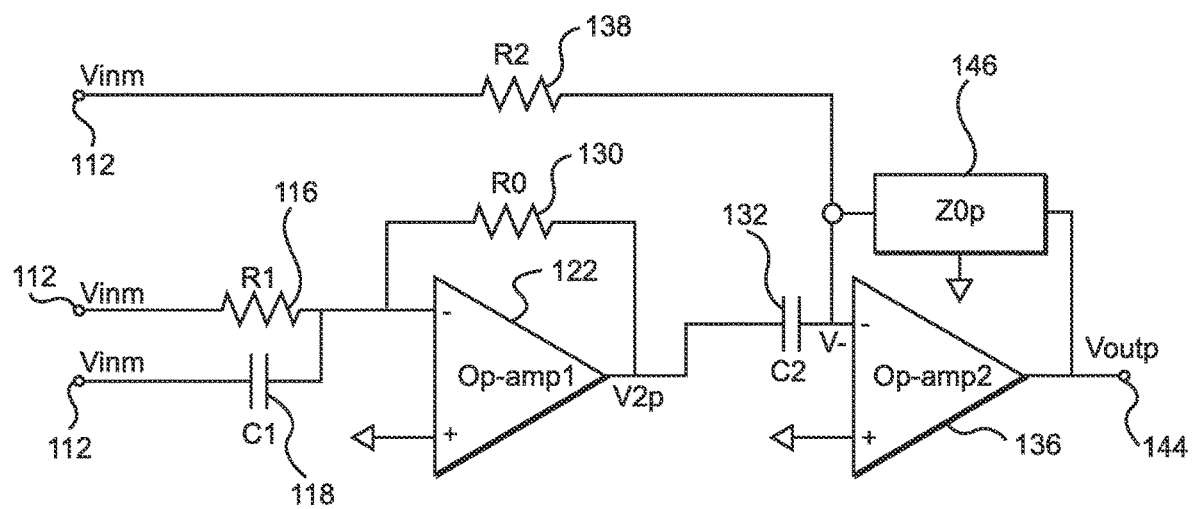
Figure 11:
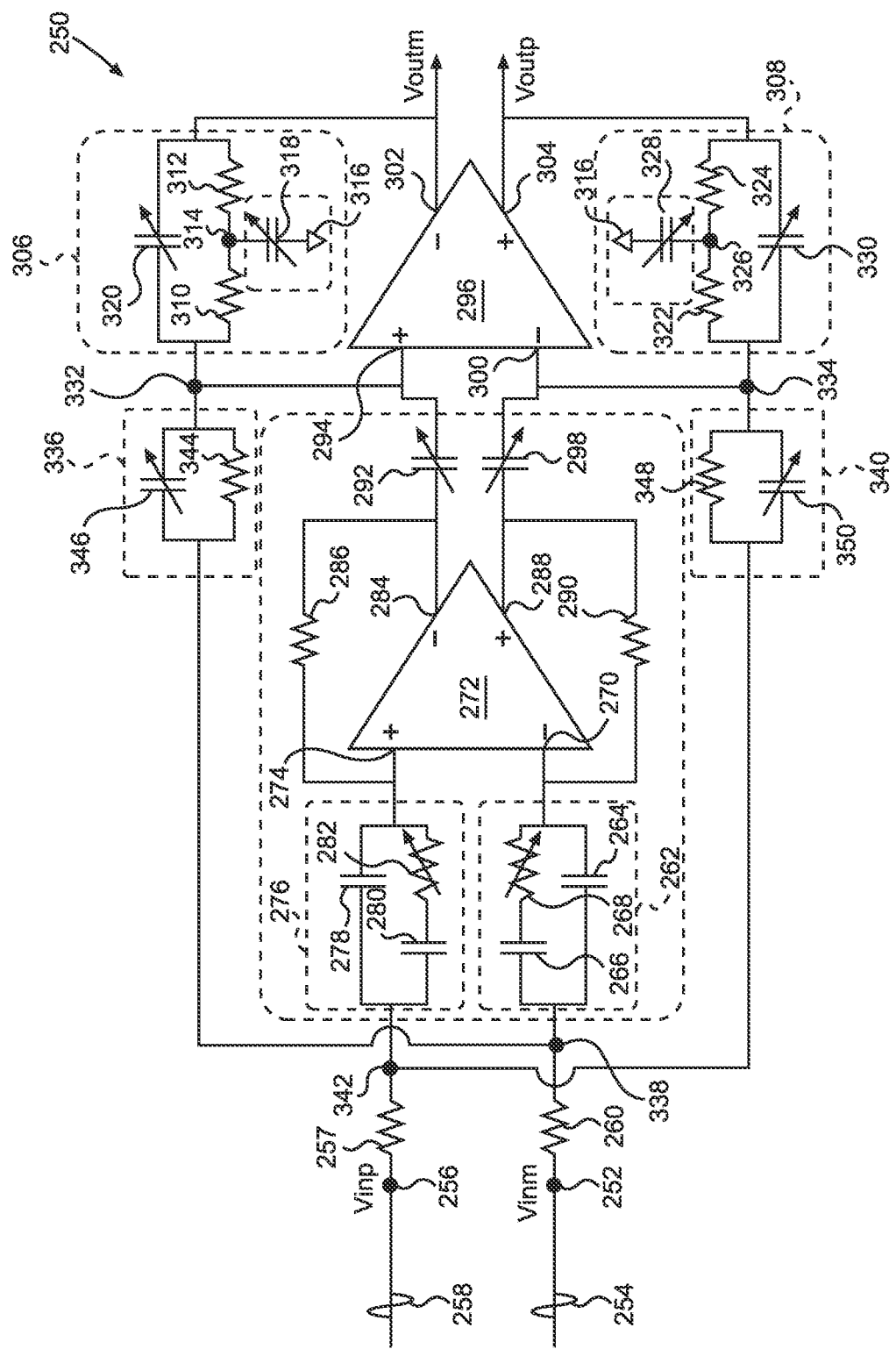

FIG. 4 is a circuit diagram of a positive branch of a differential signal in an equalizer circuit according to the present disclosure that provides both a zero and complex zeros in the transfer function to provide flat gain and flat negative group delay FIG. 5 is a circuit diagram of a negative branch of a differential signal in the equalizer circuit according to the present disclosure that provides both a zero and complex zeros in the transfer function to provide flat gain and flat negative group delay;

FIG. 6A illustrates an equivalence between a T and a H arrangement for an exemplary feedback circuit of one of the op-amps of FIGS. 4-5;

FIG. 6B illustrates an equivalence between a T and a H arrangement for another exemplary feedback circuit of one of the op-amps of FIGS. 4-5;

FIG. 7A shows a group delay versus frequency graph for an equalizer having the circuit of FIGS. 4-5 with both a zero and complex zeros in the transfer function;

FIG. 7B shows an amplitude gain response versus frequency graph for an equalizer having the circuit of FIGS. 4-5 with both a zero and complex zeros in the transfer function;

FIGS. 8-10 are circuit diagrams for alternate equalizer circuits that may be used in an ET circuit in a transmitter apparatus; and FIG. 11 is a circuit diagram of the equalizer of FIG. 4, but having a differential output.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a radio frequency (RF) equalizer in an envelope tracking (ET) circuit. In a non-limiting example, a transmitter chain includes an ET circuit having an RF equalizer therein. The RF equalizer includes a two operational amplifier (op-amp) structure that provides a relatively flat gain and a relatively constant negative group delay across a frequency range of interest (e.g., up to 200 megahertz (MHz)). The simple two op-amp structure provides frequency response equalization and time tuning adjustment and/or creates a window Vcc signal.

Before addressing the particular two op-amp structure that provides the desired functionality, a brief overview of a transmitter apparatus, ET, and a discussion of the inadequacies of conventional approaches is provided. The structure of an equalizer according to exemplary aspects of the present disclosure begins below with reference to FIG. 4.

Figure 1:
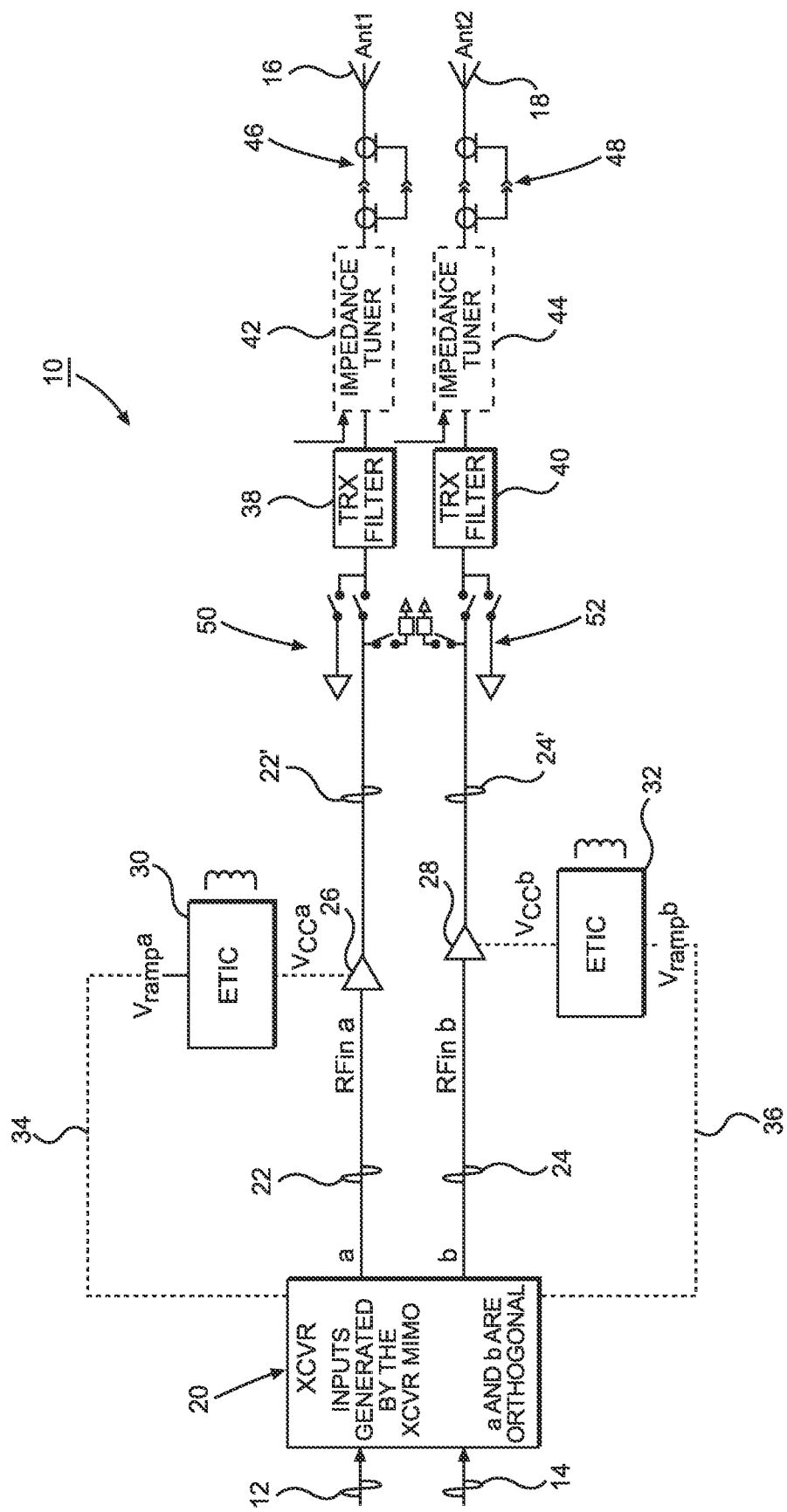
FIG. 1 is a schematic diagram of an exemplary multiple input-multiple output (MIMO) transmitter apparatus that uses an envelope tracking (ET) circuit according to an exemplary aspect of the present disclosure.

In this regard, FIG. 1 is a schematic diagram of an exemplary transmitter apparatus 10 (also referred to as a transmitter circuit) configured to amplify a first input signal 12 and a second input signal 14 for concurrent transmission from a first antenna 16 and a second antenna 18, respectively.

The transmitter apparatus 10 includes a transceiver circuit 20 configured to receive the first input signal 12 and the second input signal 14. The transceiver circuit 20 is configured to generate a first RF signal 22, sometimes referred to as signal a or RFina, from the first input signal 12 and a second RF signal 24, sometimes referred to as signal b or RFinb, from the second input signal 14.

The transmitter apparatus 10 includes two (2) power amplifier circuits 26 and 28 to amplify the first RF signal 22 and the second RF signal 24, respectively. The power amplifier circuits 26 and 28 may also be a network of power amplifiers and each may generically be referred to as power amplifier network. The two power amplifier circuits 26 and 28 are controlled by ET integrated circuits (ETICs) 30 and 32, respectively. The ETICs 30 and 32 are controlled by Vrampa signal 34 and Vrampb signal 36 from the transceiver circuit 20. In an exemplary aspect, the signals 34, 36 are differential signals.

After amplification, signals 22' and 24' are provided to respective filters 38 and 40. The filters 38 and 40 are coupled to impedance tuners 42 and 44, respectively. The impedance tuners 42 and 44 are coupled to the antennas 16 and 18, respectively, such as through a coaxial or flex line connection (noted at 46 and 48, respectively). In some instances, there may be no signal being provided to an antenna. In such instances, the line with no signal may be terminated to a known voltage level (e.g., to ground). Accordingly, termination structures 50 and 52 are provided to provide such terminations.

Figure 2:
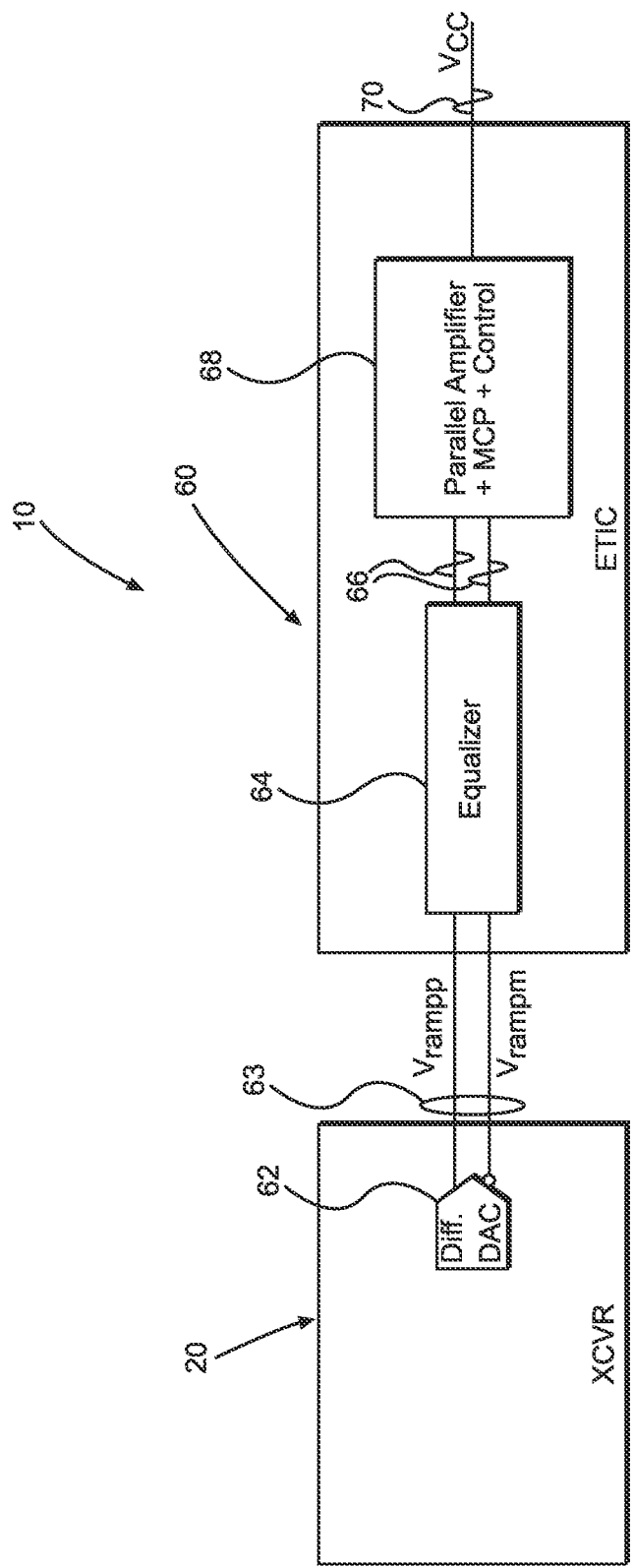
FIG. 2 is a block diagram of the ET circuit with an equalizer shown therein.

Of interest to us are the ETICs 30, 32, which are better illustrated generically as ETIC 60 in FIG. 2. The transceiver circuit 20 may include a differential digital-to-analog converter (DAC) 62 that provides a differential vramp signal 63 composed of vramp positive (vrampp) and vramp minus (vrampm) signals that are provided to the ETIC 60. The ETIC 60 includes an equalizer 64 that operates in the radio frequencies of interest and more particularly provides a flat amplitude response and a flat group delay at the frequencies of interest. It should be appreciated that the equalizer 64 has a transfer function, which may be expressed by an equation based on a Laplace transformation of the linear equation corresponding to the circuit of the equalizer 64. This transfer function will be the discussion of parts of the present disclosure below. The equalizer 64 provides a differential output signal 66 to a processing circuit 68 that may include parallel amplifiers, a microprocessor (MCP), and a control circuit or the like as is well understood. The processing circuit 68 generates an output Vcc signal 70 that is provided to the power amplifier circuits 26, 28 of FIG. 1 (depending on which ETIC 30, 32 is being considered).

Because of the speed of changes required under 5G-NR, conventional equalizers may generate a time-advanced signal such as that disclosed in commonly owned U.S. Patent Application Publication number 2018/0309414, which is herein incorporated by reference in its entirety. In traditional approaches, the transfer function of a conventional equalizer may have a real zero in the Laplace domain. However, use has shown that at such a device may not have a flat amplitude response and/or does not have a flat negative group delay response for frequencies of emerging interest (e.g., around or above 100 MHz for a −1.0 nanosecond (ns) of delay range). Experiments have shown that circuits having second order complex zeros in the Laplace domain likewise may not have a desired flat response. The lack of flatness is shown in FIGS. 3A and 3B.

Figure 3A:
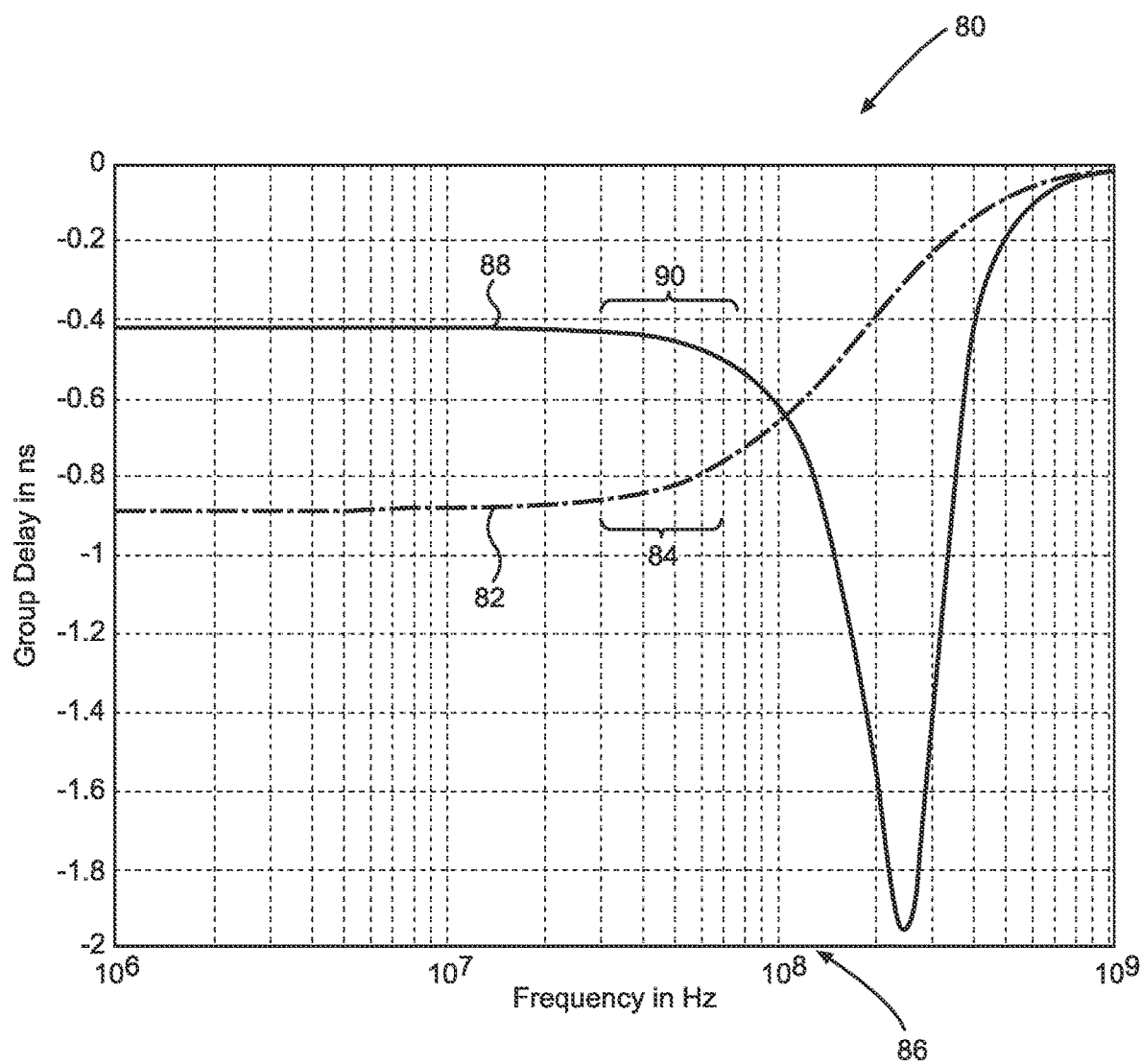
FIG. 3A shows a group delay versus frequency graph for an equalizer having either just a zero or just complex zeros in the transfer function.

Specifically, FIG. 3A shows graph 80 where the group delay in nanoseconds is on the Y-axis and the frequency is presented in semi-logarithmic format on the X-axis. Line 82 is the response for the group delay just using a real zero in the Laplace domain. Around region 84, the response becomes non-linear, well short of 100 MHz (also labeled 86). In contrast, line 88 is the response for complex zeros in the Laplace domain. Again, around region 90, the response becomes non-linear, again well short of 100 MHz.

Figure 3B:
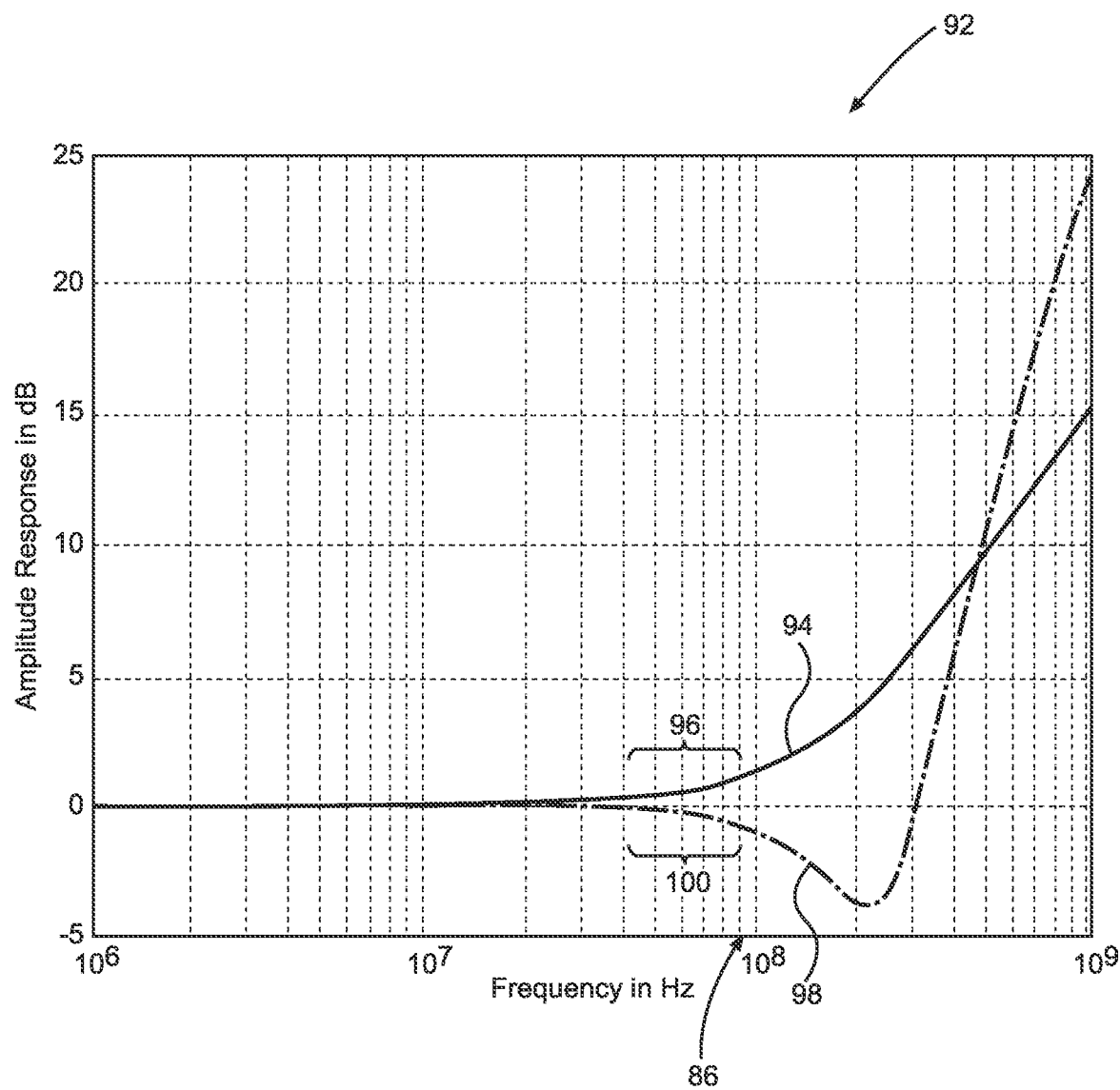
FIG. 3B shows an amplitude gain response versus frequency graph for an equalizer having just a zero or just complex zeros in the transfer function.

Similarly, FIG. 3B shows graph 92, where the Y-axis is the amplitude response in decibels (dB) and the X-axis is the frequency presented in semi-logarithmic format. Line 94 is the response for just using a real zero in the Laplace domain. Around region 96, the response becomes non-linear, well short of 100 MHz (labeled 86). Likewise, line 98 is the response for complex zeros in the Laplace domain. Again, around region 100, the response becomes non-linear, again well short of 100 MHz.

Exemplary aspects of the present disclosure provide a relatively flat amplitude response while preserving a relatively flat group delay of about −1.0 ns for the frequencies of interest (e.g., around 100 MHz). In particular, the equalizer 64 is formed using two op-amps, which, in the Laplace domain has a single real zero and a pair of complex zeros. It is assumed that vramp is a differential signal as previously described, and thus, the structure of the equalizer 64 is provided in FIGS. 4 and 5, where FIG. 4 provides a positive portion of a differential output signal and FIG. 5 provides a negative portion of the differential output signal.

In this regard, FIG. 4 illustrates a positive branch 110A of the equalizer 64. The positive branch 110A includes a minus or negative input node 112 (Vinm) and a positive input node 114 (Vinp). The positive input node 114 is coupled to an input circuit formed from a first resistor (R1) 116 and a first capacitor (C1) 118. The first capacitor 118 is positioned electrically parallel to the first resistor 116. Both the first resistor 116 and the first capacitor 118 are coupled to a negative input 120 of a first op-amp 122. A positive input 124 of the first op-amp 122 is coupled to a ground 126. An output 128 of the first op-amp 122 is coupled to a first feedback resistor (R0) 130. The first feedback resistor 130 is also coupled to the negative input 120. While a first feedback resistor 130 is illustrated, other circuits may be used as needed and thus, generically, this element may be a feedback circuit.

With continued reference to FIG. 4, the output 128 of the first op-amp 122 is also coupled to a second capacitor (C2) 132. The second capacitor 132 is coupled to a negative input 134 of a second op-amp 136. The negative input 134 is also coupled to a second resistor (R2) 138. The second resistor 138, also sometimes referred to as a second input circuit, is also coupled to the negative input node 112. A positive input 140 of the second op-amp 136 is coupled to the ground 126. An output 142 of the second op-amp 136 is coupled to a positive output node 144 that provides Voutp from the equalizer 64. The output 142 is also coupled to a feedback impedance network 146. The feedback impedance network 146 is coupled to the negative input 134 of the second op-amp 136.

In an exemplary aspect, the feedback impedance network 146 includes a first resistor (R0p1) 148 serially connected to a second resistor (R0p2) 150 with a node 152 therebetween. A capacitor (C0p) 154 couples the node 152 to ground 126. The first resistor 148 couples to the negative input 134. The second resistor 150 couples to the positive output node 144.

The negative or minus branch 110B of the equalizer 64 is illustrated in FIG. 5 and is structurally substantially similar, but with the input nodes reversed. Specifically, in the negative branch 110B the negative input node 112 is coupled to a first resistor (R1) 116' and a first capacitor (C1) 118'. The first capacitor 118' is positioned electrically parallel to the first resistor 116'. Both the first resistor 116' and the first capacitor 118' are coupled to a negative input 120' of a first op-amp 122'. A positive input 124' of the first op-amp 122' is coupled to the ground 126. An output 128' of the first op-amp 122' is coupled to a first feedback resistor (R0) 130' (also referred to as a feedback circuit). The first feedback resistor 130' is also coupled to the negative input 120'.

With continued reference to FIG. 5, the output 128' of the first op-amp 122' is also coupled to a second capacitor (C2) 132'. The second capacitor 132' is coupled to a negative input 134' of a second op-amp 136'. The negative input 134' is also coupled to a second resistor (R2) 138'. The second resistor 138' is also coupled to the positive input node 114. A positive input 140' of the second op-amp 136' is coupled to the ground 126. An output 142' of the second op-amp 136' is coupled to a negative output node 160 that provides Voutm from the equalizer 64. The output 142' is also coupled to a feedback impedance network 146'. The feedback impedance network 146' is coupled to the negative input 134' of the second op-amp 136'.

In an exemplary aspect, the feedback impedance network 146' includes a first resistor (R0p1) 148' serially connected to a second resistor (R0p2) 150' with a node 152' therebetween. A capacitor (C0p) 154' couples the node 152' to ground 126. The first resistor 148' couples to the negative input 134'. The second resistor 150' couples to the negative output node 160.

It should be appreciated that the positive branch 110A and the negative branch 1108 can be combined to provide a differential output signal by combining the outputs at the output nodes 144 and 160. Alternatively, a single branch can be modified to have a differential output as better seen in FIG. 11. Specifically, an equalizer 250 may include a includes a minus or negative input node 252 (Vinm) that receives the Vrampm signal 254 and a positive input node 256 (Vinp) that receives the Vrampp signal 258. The negative input node 252 is coupled to an input circuit formed from a first resistor (R1) 260 and a first input circuit 262. The first input circuit 262 includes a first capacitor 264, a second capacitor 266, and a variable resistor 268. The first capacitor 264 acts to block DC signals. The second capacitor 266 and the variable resistor 268 are electrically serially positioned with respect to one another and collectively are parallel to the first capacitor 264. The first input circuit 262 is coupled to a first negative input 270 of a first op-amp 272. A first positive input 274 of the first op-amp 272 is coupled to a second input circuit 276. The second input circuit 276 includes a third capacitor 278, a fourth capacitor 280, and a variable resistor 282. The third capacitor 278 acts to block DC signals. The fourth capacitor 280 and the variable resistor 282 are electrically serially positioned with respect to one another and collectively are parallel to the third capacitor 278.

A first negative output 284 of the first op-amp 272 is coupled to a first feedback resistor 286. The first feedback resistor 286 is also coupled to the first positive input 274. While a first feedback resistor 286 is illustrated, other circuits may be used as needed, and thus, generically, this element may be a feedback circuit. Similarly, a first positive output 288 of the first op-amp 272 is coupled to a second feedback resistor 290. The second feedback resistor 290 is also coupled to the first negative input 270. Again, the feedback resistor 290 may be replaced with other elements and may generally be a feedback circuit.

The first negative output 284 is also coupled to a first variable capacitor 292, which in turn is coupled to a second positive input 294 of a second op-amp 296. Similarly, the first positive output 288 is coupled to a second variable capacitor 298, which in turn is coupled to a second negative input 300 of the second op-amp 296.

With continued reference to FIG. 11, the second op-amp 296 includes a second negative output 302, which provides an output signal Voutm. The second op-amp 296 also includes a second positive output 304, which provides an output signal Voutp. The second negative output 302 is also coupled to a first feedback impedance network 306. The second positive output 304 is also coupled to a second feedback impedance network 308. The first feedback impedance network 306 includes resistors 310 and 312 serially arranged with a node 314 therebetween. The node 314 is coupled to a ground 316 through a variable capacitor 318. A variable capacitor 320 is positioned electrically parallel to the resistors 310, 312. The second feedback impedance network 308 includes resistors 322 and 324 serially arranged with a node 326 therebetween. The node 326 is coupled to the ground 316 through a variable capacitor 328. A variable capacitor 330 is positioned electrically parallel to the resistors 322, 324.

With continued reference to FIG. 11, the first feedback impedance network 306 couples through node 332 to the second positive input 294. Similarly, the second feedback impedance network 308 couples through node 334 to the second negative input 300. A third impedance network 336 connects the node 332 to a node 338 between the first resistor 260 and the first input circuit 262. Similarly, a fourth impedance network 340 connects the node 334 to a node 342 between a resistor 257 and the second input circuit 276. The third impedance network 336 includes a resistor 344 and a variable capacitor 346 parallel to one another. Similarly, the fourth impedance network 340 includes a resistor 348 and a variable capacitor 350 parallel to one another.

The first and second feedback impedance networks 306, 308 provide the poles in the Laplace domain while the third and fourth impedance networks 336, 340 provide the zeros.

Returning loosely to FIG. 4, a brief detour of math is provided to show the transfer function H(s) of the positive branch 110A of the equalizer 64. Specifically, the second order complex zero portion of the equalizer 64 may be expressed by a Q and f0 term, and the real zero is expressed by its time constant $\tau_p$. Thus, the transfer function can be expressed as:

$$H(s)=(1+\tau_p{}^*s)^*(1+1/((Q^*\omega_0)^*s)+s^2/\omega_0{}^2)$$

And $$Voutp/Vinp=(R0p1+R0p2)/R2*[1+(R0p1*R0p2)/((R0p1+R0p2)*C0p*s)]*[1+R2*R0/(R1*C2*s*(1+R1*C1*s)])$$

$$\omega_0=1/sqrt(R0*R2*C1*C2)$$

$$Q=R1/(Sqrt(R0*R2))*sqrt(C1/C2),$$

which can be set to greater than ½ for complex conjugate zeros $$R0p=R0p1+R0p2$$

$$R0p\_parallel=R0p1*R0p2/(R0p1+R0p2)$$

Thus, $$Voutp/Vinp=R0p/R2*[1+R0p\_parallel*C0p*s]*[1+R2*R0/(R1*C2*s+R2*R0*C2*C1*s^2)]$$

Thus, the real zero may be controlled by adjusting the value of C0p independently of the second order complex zeros.

The T-network shape of the feedback impedance network 146 has an equivalent Π network illustrated in FIG. 6A as network 146Π. The network 146ø has a resistor 170 that has a resistance equal to R0p1+R0p2 and an inductor 172 with an inductance Leq=R0p1*R0p2*C0p. Shunts 174, 176 to the ground 126 occur at the negative input 134. These shunts have no impact on the transfer function within the operational bandwidth of the op-amps. Because of the equivalent inductance, a real pole is created in the Laplace domain without having to use an inductor in the actual the circuit.

Equivalently, the zeros and poles may be adjusted in the equalizer 250 by varying the variable capacitors 318, 328, 346, 350 as needed.

FIG. 6B provides a slightly different feedback impedance network 180, where a third resistor 182 is added between the capacitor 154 and the ground 126. The addition of the third resistor 182 adds a real pole in the Laplace domain in which frequency is above the real zero. Alternatively, a capacitance placed across the negative input 134 and the positive output node 144 (not shown) would also get a real pole.

The net result of the equalizer 64 is provided with reference to FIGS. 7A and 7B, analogous to FIGS. 3A and 3B, but showing how flat the group delay and amplitude response are over the frequencies of interest. Specifically, FIG. 7A shows a graph 200 with the group delay in ns on the Y-axis and the frequency in semi-logarithmic fashion on the X-axis. Line 202 is the response of the equalizer 64. It should be appreciated that the line 202 remains substantially flat through 100 MHz (point 204 on the X-axis). Note also that the group delay is actually greater than the target −1.0 ns, being approximately −1.3 ns. Similarly, FIG. 7B shows a graph 206 with the amplitude response in dB on the Y-axis and the frequency in semi-logarithmic fashion on the X-axis. Line 208 remains substantially flat through 200 MHz and definitely through point 204 (100 MHz).

The net improvement in amplitude response while preserving a group delay greater than −1.0 ns is a substantial improvement over the responses of conventional equalizers shown in FIGS. 3A and 3B.

Note that other variations may exist for the equalizer 64. For example, as illustrated by FIG. 8, by connecting the negative input node 112 to the first resistor 116 instead of the positive input node 114 (see FIG. 4 for comparison), a negative Q may be formed and the transfer function becomes:

$$H(s)=(1+\tau_p*s)*(1-1/((Q*\omega_0)*s)+s^2/\omega_0^2)$$

And $$Voutp/Vinp=R0p/R2*[1+R0p\_parallel*C0p*s]*[1-R2*R0/(R1*C2*s+R2*R0*C2*C1*s^2)]$$

In FIG. 9, a negative $s^2$ term may be formed by connecting the negative input node 112 to the first capacitor 118 and the positive input node 114 to just the first resistor 116. Thus, the transfer function becomes:

$$H(s)=(1+\tau_p*s)*(1+1/((Q*\omega_0)*s)-s^2/\omega_0^2)$$

And $$Voutp/Vinp=R0p/R2*[1+R0p\_parallel*C0p*s]*[1+R2*R0/(R1*C2*s-R2*R0*C2*C1*s^2)]$$

Finally, FIG. 10 illustrates a structure with both a negative Q and a negative $s^2$ term. In particular, the positive input node 114 is not connected at all, and the negative input node 112 is connected to both the first resistor 116 and the first capacitor 118 as well as the second resistor 138. The transfer function becomes:

$$H(s)=(1+\tau_p*s)*(1-1/((Q*\omega_0)*s)-s^2/\omega_0^2)$$

And $$Voutp/Vinp=R0p/R2*[1+R0p\_parallel*C0p*s]*[1-R2*R0/(R1*C2*s-R2*R0*C2*C1*s^2)]$$

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) circuit comprising:
   an equalizer comprising a first branch, the first branch comprising:
   a positive differential input node;
   a negative differential input node;
   a first operational amplifier (op-amp) comprising:
      a first negative input coupled to the positive differential input node; and
      a first output;
   a first feedback circuit coupling the first output to the first negative input;
   a second op-amp comprising:
      a second negative input coupled to the negative differential input node and the first output; and
      a second output; and
   a second feedback impedance network coupling the second output to the second negative input.

2. The ET circuit of claim 1, wherein the first feedback circuit comprises a resistor.

3. The ET circuit of claim 1, wherein the second feedback impedance network comprises:
   a first resistor;
   a second resistor coupled to the first resistor with a node therebetween; and
   a capacitor coupling the node to ground.

4. The ET circuit of claim 1, further comprising a capacitor connected to the first output and the second negative input.

5. The ET circuit of claim 1, further comprising a first input circuit coupled to the first negative input and comprising a resistor and a capacitor electrically parallel to one another.

6. The ET circuit of claim 1, further comprising a second input circuit coupled to the second negative input and comprising a resistor.

7. The ET circuit of claim 1, wherein the first op-amp further comprises a positive input coupled to ground.

8. The ET circuit of claim 1, wherein the second op-amp further comprises a positive input coupled to ground.

9. The ET circuit of claim 1, wherein the second feedback impedance network comprises:
a first resistor;
a second resistor coupled to the first resistor with a node therebetween;
a capacitor coupled to the node; and
a third resistor coupling the capacitor to ground.

10. The ET circuit of claim 1, further comprising a second branch, the second branch comprising:
a second positive differential input node;
a second negative differential input node;
a third op-amp comprising:
a third negative input coupled to the second negative differential input node; and
a third output;
a third feedback circuit coupling the third output to the third negative input;
a fourth op-amp comprising:
a fourth negative input coupled to the second positive differential input node and the third output; and
a fourth output; and
a fourth feedback impedance network coupling the fourth output to the fourth negative input.

11. A transmitter circuit comprising:
a transceiver;
an amplifier network coupled to the transceiver; and
an envelope tracking (ET) circuit coupled to the transceiver and the amplifier network,
the ET circuit comprising:
an equalizer comprising:
a positive differential input node;
a negative differential input node;
a first operational amplifier (op-amp) comprising:
a first negative input coupled to the positive differential input node; and
a first output;
a first feedback circuit coupling the first output to the first negative input;
a second op-amp comprising:
a second negative input coupled to the negative differential input node and the first output; and
a second output; and
a second feedback impedance network coupling the second output to the second negative input.

12. An envelope tracking (ET) circuit comprising:
an equalizer comprising:
a positive input node;
a negative input node;
a first operational amplifier (op-amp) comprising:
a first negative input coupled to the negative input node;
a first negative output;
a first positive input coupled to the positive input node; and
a first positive output;
a first feedback circuit coupling the first positive output to the first negative input;
a second feedback circuit coupling the first negative output to the first positive input;
a second op-amp comprising:
a second negative input coupled to the first positive output;
a second positive input coupled to the first negative output;
a second negative output; and
a second positive output;
a first feedback impedance network coupling the second negative output to the second positive input;
a second feedback impedance network coupling the second positive output to the second negative input node; and
a third impedance network coupling the second positive input to the negative input node.

13. The ET circuit of claim 12, further comprising a fourth impedance network coupling the second negative input to the positive input node.

14. The ET circuit of claim 12, further comprising a first input circuit serially positioned between the negative input node and the first negative input.

15. The ET circuit of claim 14, further comprising a second input circuit serially positioned between the positive input node and the first positive input.

16. The ET circuit of claim 12, wherein the first feedback impedance network comprises:
two serially coupled resistors with a node therebetween, the node coupled to ground through a variable capacitor; and
a second variable capacitor electrically parallel to the two serially coupled resistors.

17. The ET circuit of claim 12, wherein the third impedance network comprises a variable capacitor and a resistor, the resistor electrically parallel to the variable capacitor.

18. The ET circuit of claim 17, further comprising a fourth impedance network, wherein the fourth impedance network comprises a second variable capacitor and a second resistor, the second resistor electrically parallel to the second variable capacitor.

19. The ET circuit of claim 12, further comprising a variable capacitor electrically positioned between the first negative output and the second positive input.

20. A method of operating an envelope tracking circuit, comprising:
receiving a differential signal at a positive differential input node and a negative differential input node;
sending signals from the positive differential input node to a first negative input of a first operational amplifier (op-amp);
providing a first feedback signal through a first feedback circuit from a first output of the first op-amp to the first negative input;
sending signals from the negative differential input node to a second negative input of a second op-amp;
coupling the first output to the second negative input;
providing a second feedback signal through a second feedback impedance network from a second output of the second op-amp to the second negative input.

* * * * *

UNITED STATES PATENT AND TRADEMARK OFFICE
CERTIFICATE OF CORRECTION

PATENT NO. : 12,126,305 B2
APPLICATION NO. : 17/331996
DATED : October 22, 2024
INVENTOR(S) : Nadim Khlat It is certified that error appears in the above-identified patent and that said Letters Patent is hereby corrected as shown below:

In the Specification

In Column 3, Line 39, replace "Π" with --Π--.

In Column 3, Line 42, replace "Π" with --Π--.

In Column 7, Line 48, replace "branch 110B" with --branch 110B--.

In Column 9, Line 21, replace "equivalent Π network" with --equivalent Π network--.

In Column 9, Line 22, replace "146Π" with --146Π--.

In Column 9, Line 22, replace "146φ" with --146Π--.

Signed and Sealed this
Nineteenth Day of November, 2024

Katherine Kelly Vidal
*Director of the United States Patent and Trademark Office*